(12) United States Patent
Kim et al.

(10) Patent No.: US 11,060,019 B2
(45) Date of Patent: Jul. 13, 2021

(54) COMPOSITIONS, QUANTUM DOT POLYMER COMPOSITE, AND LAYERED STRUCTURES AND ELECTRONIC DEVICES INCLUDING THE SAME

(71) Applicant: SAMSUNG ELECTRONICS CO., LTD., Suwon-si (KR)

(72) Inventors: Yongwook Kim, Yongin-si (KR); Eun Joo Jang, Suwon-si (KR); Tae Gon Kim, Hwaseong-si (KR); Shang Hyeun Park, Yongin-si (KR); Hyo Sook Jang, Suwon-si (KR); Young-soo Jeong, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 239 days.

(21) Appl. No.: 16/158,483

(22) Filed: Oct. 12, 2018

(65) Prior Publication Data

US 2019/0112523 A1 Apr. 18, 2019

(30) Foreign Application Priority Data

Oct. 12, 2017 (KR) .................. 10-2017-0132796

(51) Int. Cl.
| | | |
|---|---|---|
| C09K 11/65 | (2006.01) | |
| C09K 11/02 | (2006.01) | |
| B82Y 20/00 | (2011.01) | |
| B82Y 30/00 | (2011.01) | |
| B82Y 40/00 | (2011.01) | |
| C09K 11/88 | (2006.01) | |
| C09K 11/08 | (2006.01) | |
| G02F 1/1335 | (2006.01) | |
| G02F 1/13357 | (2006.01) | |
| H01L 27/32 | (2006.01) | |

(52) U.S. Cl.
CPC .......... *C09K 11/02* (2013.01); *C09K 11/0883* (2013.01); *C09K 11/65* (2013.01); *C09K 11/883* (2013.01); *G02F 1/133514* (2013.01); *G02F 1/133617* (2013.01); *B82Y 20/00* (2013.01); *B82Y 30/00* (2013.01); *B82Y 40/00* (2013.01); *G02F 1/133512* (2013.01); *G02F 1/133528* (2013.01); *G02F 1/133614* (2021.01); *G02F 1/133621* (2013.01); *G02F 2202/36* (2013.01); *H01L 27/322* (2013.01)

(58) Field of Classification Search
None
See application file for complete search history.

(56) References Cited

U.S. PATENT DOCUMENTS

| | | | | |
|---|---|---|---|---|
| 2016/0088756 | A1* | 3/2016 | Ramadas | ................ B32B 27/00 |
| | | | | 361/728 |
| 2017/0152145 | A1* | 6/2017 | Tour | ...................... C01B 32/182 |
| 2017/0346031 | A1 | 11/2017 | Lee et al. | |
| 2018/0006257 | A1* | 1/2018 | Yu | ........................... H05B 45/20 |
| 2018/0044583 | A1* | 2/2018 | Kwon | ..................... C08K 9/04 |

FOREIGN PATENT DOCUMENTS

| | | | |
|---|---|---|---|
| KR | 1020160055093 A | 5/2016 | |
| KR | 1020160067812 A | 6/2016 | |

OTHER PUBLICATIONS

Chen et al., "High efficient light-emitting diodes based on liquid-type carbon dots", RSC Advances, 6, 2016, 96798-96802.

Chung et al., "Extremely high color rendering white light from surface passivated carbon dots and Zn-doped AgInS2 nanocrystals", Journal of Materials Chemistry C, 2, 2014, 4227-4232.

He et al., "Two-step synthesis of highly emissive C/ZnO hybridized quantum dos with a broad visible photoluminescence", Applied Surface Science, 364, 2016, 710-717.

Su et al., "Recent Progress in Quantum Dot Based White Light-Emitting Devices", Top Curr Chem (Z), 2016, 374:42, 1-25.

Sun et al., "High color rendering index white light emitting diodes fabricated from a combination of carbon dots and zinc copper indium sulfide quantum dots", Applied Physics Letters, 104, 2014, 261106-1-261106-4.

Zhang et al., "Preparation of high-quality biocompatible carbon dots by extraction, with new thoughts on the luminescence mechanisms", Nanotechnology, 24, 2013, 1-8.

\* cited by examiner

*Primary Examiner* — Sheeba Ahmed

(74) *Attorney, Agent, or Firm* — Cantor Colburn LLP

(57) ABSTRACT

A composition comprising: a plurality of quantum dots; a plurality of luminous carbon nanoparticles; a carboxylic acid group-containing binder; a polymerizable monomer including a carbon-carbon double bond; and an initiator, wherein the plurality of quantum dots comprises a Group II-VI compound, a Group III-V compound, a Group IV-VI compound, or a combination thereof, the plurality of luminous carbon nanoparticles have a size of less than or equal to about 10 nanometers, and exhibit both a D band and a G band in a Raman spectrum thereof, and at least a portion of the plurality of luminous carbon nanoparticles absorb light having a wavelength of greater than or equal to about 400 nanometers and a maximum luminous peak wavelength thereof is greater than or equal to about 480 nanometers.

26 Claims, 8 Drawing Sheets

COMPOSITIONS, QUANTUM DOT POLYMER COMPOSITE, AND LAYERED STRUCTURES AND ELECTRONIC DEVICES INCLUDING THE SAME

CROSS-REFERENCE TO RELATED APPLICATION

This application claims priority to Korean Patent Application No. 10-2017-0132796, filed in the Korean Intellectual Property Office on Oct. 12, 2017, and all the benefits accruing therefrom under 35 U.S.C. § 119, the content of which is incorporated herein in its entirety by reference.

BACKGROUND

1. Field

A composition, a quantum dot-polymer composite, and a layered structure and an electronic device including the same are disclosed.

2. Description of the Related Art

Quantum dots (e.g., semiconductor nanocrystal particles) may be used for various display devices in the form of a quantum dot (QD)-polymer composite or a quantum dot pattern. In order to be used in various devices, there remains a need for a quantum dot-polymer composite capable of showing, e.g., exhibiting, enhanced luminous properties.

SUMMARY

An embodiment provides a composition (e.g., a photosensitive composition or a ink composition) from which a quantum dot-polymer composite or a pattern thereof may be prepared.

An embodiment provides a quantum dot-polymer composite that may be prepared from the aforementioned composition (e.g., photosensitive composition or a ink composition).

An embodiment provides a layered structure including the quantum dot-polymer composite that may be prepared from the aforementioned composition (e.g., photosensitive composition or a ink composition).

An embodiment provides an electronic device including the quantum dot-polymer composite or the layered structure.

In an embodiment, a composition includes:
a plurality of quantum dots;
a plurality of luminous carbon nanoparticles;
a carboxylic acid group-containing binder;
a polymerizable (e.g., photopolymerizable) monomer including a carbon-carbon double bond; and
an initiator (e.g., a photoinitiator),
wherein the plurality of quantum dots includes a Group II-VI compound, a Group III-V compound, a Group IV-VI compound, or a combination thereof,
the plurality of luminous carbon nanoparticles have a size (e.g., an average size) of less than or equal to about 10 nanometers (nm), and exhibit both a D band and a G band in a Raman spectrum thereof, and
at least a portion of the plurality of luminous carbon nanoparticles absorb light having a wavelength of greater than or equal to about 400 nm (e.g., greater than or equal to about 420 nm) and a maximum luminous (e.g., photoluminescent) peak wavelength of the plurality of luminous carbon nanoparticles is greater than or equal to about 480 nm (e.g., greater than or equal to about 500 nm).

The plurality of quantum dots may not include cadmium.

The plurality of luminous carbon nanoparticles may have a size (e.g., an average size) of greater than or equal to about 1 nm, for example, greater than or equal to about 2 nm, greater than or equal to about 3 nm, or greater than or equal to about 4 nm, and less than or equal to about 10 nm, for example, less than or equal to about 9 nm, less than or equal to about 8 nm, less than or equal to about 7 nm, less than or equal to about 6 nm, or less than or equal to about 5 nm.

A quantum dot of the plurality of quantum dots may include a core including a first semiconductor nanocrystal material and a shell disposed on the core and including a second semiconductor nanocrystal material, the second semiconductor nanocrystal material being different from the first semiconductor nanocrystal material, and the core may include a metal and a non-metal, the metal including indium, zinc, or a combination thereof, and the non-metal including phosphorous, selenium, tellurium, or a combination thereof, and the shell may include zinc, sulfur, and optionally selenium.

The quantum dots may not include copper.

The quantum dots may not include a zinc-indium sulfide.

In the Raman spectrum of the luminous carbon nanoparticles, an integral value of a D band may be greater than an integral value of a G band.

At least a portion of the plurality of luminous carbon nanoparticles may absorb light having a wavelength of greater than or equal to about 420 nm and a maximum luminous peak wavelength thereof may be greater than or equal to about 510 nm.

At least a portion of the plurality of luminous carbon nanoparticles may absorb light having a wavelength of greater than or equal to about 450 nm (e.g., greater than or equal to about 455 nm or greater than or equal to about 460 nm) and a maximum luminous peak wavelength thereof may be greater than or equal to about 530 nm (e.g., greater than or equal to about 535 nm or greater than or equal to about 540 nm).

The plurality of luminous carbon nanoparticles may show a quantum efficiency of greater than or equal to about 10% (e.g., greater than or equal to about 20%).

An amount of the plurality of luminous carbon nanoparticles may be greater than or equal to about 1 part by weight and less than or equal to about 33 parts by weight, with respect to 100 parts by weight of the plurality of quantum dots.

An amount of the plurality of luminous carbon nanoparticles may be greater than or equal to about 2 parts by weight and less than or equal to about 15 parts by weight, with respect to 100 parts by weight of the plurality of quantum dots.

The carboxylic acid group-containing binder may have an acid value of greater than or equal to about 50 milligrams of KOH per gram and less than or equal to about 250 milligrams of KOH per gram.

The carboxylic acid group-containing binder includes a copolymer of a monomer combination including a first monomer, a second monomer, and optionally a third monomer, the first monomer including a carboxylic acid group and a carbon-carbon double bond, the second monomer including a carbon-carbon double bond and a hydrophobic moiety and not including a carboxylic acid group, and the third monomer including a carbon-carbon double bond and a hydrophilic moiety and not including a carboxylic acid group;

a multi-aromatic ring-containing polymer including a carboxylic acid group and including a backbone structure in a main chain, wherein the backbone structure includes a cyclic group including a quaternary carbon atom and two aromatic rings bound to the quaternary carbon atom; or a combination thereof.

The polymerizable monomer may include a (meth)acrylate monomer including at least one (e.g., two, three, four, five, six, seven, eight, or more) (meth)acrylate groups.

The composition may further include a multi-thiol compound represented by Chemical Formula 1, a metal oxide fine particle, or a combination thereof:

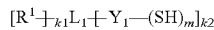    Chemical Formula 1 wherein, $R^1$ is hydrogen, a substituted or unsubstituted C1 to C40 linear or branched alkyl group, a C2 to C40 linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —$NH_2$, a substituted or unsubstituted C1 to C30 amine group of the formula —NRR' (wherein R and R' are the same or different, and are independently hydrogen or a C1 to C30 linear or branched alkyl group, and R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide group of the formula (—RC(=O)X (wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group) or a combination thereof, $L_1$ is a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C3 to C30 heterocycloalkylene group, wherein at least one methylene (—$CH_2$—) of the substituted or unsubstituted C1 to C30 alkylene group or the substituted or unsubstituted C2 to C30 alkenylene group may be replaced by a sulfonyl group (—S(=O)$_2$—), a carbonyl group (—O(=O)—), an ether group (—O—), a sulfide group (—S—), a sulfoxide group (—S(=O)—), an ester group (—O(=O)O—), an amide group (—O(=O)NR—) (wherein R is hydrogen or a C1 to C10 alkyl group), or a combination thereof, $Y_1$ is a single bond, a substituted or unsubstituted C1 to C30 alkylene group, a substituted or unsubstituted C2 to C30 alkenylene group, or a C2 to C30 alkylene group or a C3 to C30 alkenylene group in which at least one methylene group (—$CH_2$—) is replaced by a sulfonyl group (—S(=O)$_2$—), a carbonyl group (—O(=O)—), an ether group (—O—), a sulfide group (—S—), a sulfoxide group (—S(=O)—), an ester group (—O(=O)O—), an amide group (—O(=O) NR—) (wherein R is hydrogen or a C1 to C10 linear or branched alkyl group), an imine group represented by —NR— (wherein R is hydrogen or a C1 to C10 linear or branched alkyl group), or a combination thereof, m is an integer of 1 or greater, k1 is 0 or an integer of 1 or greater, k2 is an integer of 1 or greater, and a sum of m and k2 is an integer of 3 or greater, provided that m does not exceed the valence of $Y_1$ when $Y_1$ is not a single bond, and provided that a sum of k1 and k2 does not exceed the valence of $L_1$.

Based on a solid content weight of the composition, an amount of the plurality of quantum dots may be about 1 weight percent to about 75 weight percent;

an amount of the plurality of luminous carbon nanoparticles may be about 0.01 weight percent to about 25 weight percent;

an amount of the carboxylic acid group-containing binder may be about 1 weight percent to about 70 weight percent;

an amount of the polymerizable monomer may be about 1 weight percent to about 70 weight percent; and an amount of the initiator may be about 0.01 weight percent to about 10 weight percent.

In some embodiments, a quantum dot-polymer composite includes a polymer matrix; and a plurality of quantum dots and a plurality of luminous carbon nanoparticles dispersed in the polymer matrix, wherein the plurality of quantum dot includes a Group II-VI compound, a Group III-V compound, a Group IV-VI compound, or a combination thereof, the plurality of luminous carbon nanoparticles have a size (e.g., an average size) of less than or equal to about 10 nm, and exhibit both a D band and a G band in a Raman spectrum thereof, and at least a portion of the plurality of luminous carbon nanoparticles absorb light having a wavelength of greater than or equal to about 400 nm and a maximum luminous peak wavelength thereof is greater than or equal to about 480 nm.

The polymer matrix may include a carboxylic acid group-containing binder, a cross-linked polymerization product of a photopolymerizable monomer including a carbon-carbon double bond, or a combination thereof.

The carboxylic acid group-containing binder includes a copolymer of a monomer combination including a first monomer, a second monomer, and optionally a third monomer, the first monomer including a carboxylic acid group and a carbon-carbon double bond, the second monomer including a carbon-carbon double bond and a hydrophobic moiety and not including a carboxylic acid group, and the third monomer including a carbon-carbon double bond and a hydrophilic moiety and not including a carboxylic acid group;

a multi-aromatic ring-containing polymer including a carboxylic acid group and a backbone structure in a main chain, wherein the backbone structure includes a cyclic group including a quaternary carbon atom and two aromatic rings bound to the quaternary carbon atom; or a combination thereof.

The carboxylic acid group-containing binder may have an acid value of greater than or equal to about 50 milligrams of KOH per gram and less than or equal to about 250 milligrams of KOH per gram.

The plurality of quantum dots may not include cadmium.

A quantum dot of the plurality of quantum dots may include a core including a first semiconductor nanocrystal material and a shell disposed on the core and including a second semiconductor nanocrystal material, the second semiconductor nanocrystal material being different from the first semiconductor nanocrystal material, and the core may include a metal and a non-metal, the metal including indium, zinc, or a combination thereof, and the non-metal including phosphorous, selenium, tellurium, or a combination thereof, and the shell may include zinc, sulfur, and optionally selenium.

The plurality of quantum dots may have a maximum luminous peak wavelength in a range from about 500 nm to about 650 nm, The plurality of quantum dots may have a quantum yield of greater than or equal to about 70%.

The plurality of luminous carbon nanoparticles may have a size (e.g., an average size) of greater than or equal to about 1 nm, for example, greater than or equal to about 2 nm, greater than or equal to about 3 nm, or greater than or equal to about 4 nm, and less than or equal to about 10 nm, for example, less than or equal to about 9 nm, less than or equal to about 8 nm, less than or equal to about 7 nm, less than or equal to about 6 nm, or less than or equal to about 5 nm.

In the Raman spectrum of the plurality of luminous carbon nanoparticles, an integral value of a D band may be greater than an integral value of a G band.

At least a portion of the plurality of luminous carbon nanoparticles may absorb light having a wavelength of greater than or equal to about 450 nm (e.g., greater than or equal to about 455 nm or greater than or equal to about 460 nm) and a maximum luminous peak wavelength may be greater than or equal to about 530 nm (e.g., greater than or equal to about 535 nm or greater than or equal to about 540 nm).

An amount of the plurality of luminous carbon nanoparticles may be greater than or equal to about 1 part by weight and less than or equal to about 33 parts by weight, for example, greater than or equal to about 2 part by weight and less than or equal to about 15 parts by weight, with respect to 100 parts by weight of the plurality of quantum dots.

The quantum dot polymer composite may be a film having a thickness of about 5 micrometers (μm) to about 10 μm and an absorption rate of the quantum dot polymer composite with respect to light having a wavelength of 450 nm may be greater than or equal to about 80%.

Based on a total weight of the quantum dot polymer composite, an amount of the polymer matrix may be greater than or equal to about 1 weight percent and less than or equal to about 75 weight percent, an amount of the plurality of the quantum dots may be greater than or equal to about 1 weight percent and less than or equal to about 75 weight percent, and an amount of the plurality of luminous carbon nanoparticles may be greater than or equal to about 0.01 weight percent and less than or equal to about 25 weight percent.

In some embodiments, an ink composition includes a plurality of quantum dots; a plurality of luminous carbon nanoparticles; and a liquid vehicle, wherein the plurality of quantum dot includes a Group II-VI compound, a Group III-V compound, a Group IV-VI compound, or a combination thereof, the plurality of luminous carbon nanoparticles have a size (e.g., an average size) of less than or equal to about 10 nm, and exhibit both a D band and a G band in a Raman spectrum thereof, and at least a portion of the plurality of luminous carbon nanoparticles absorb light having a wavelength of greater than or equal to about 400 nm (e.g., greater than or equal to about 420 nm) and a maximum luminous peak wavelength of the plurality of luminous carbon nanoparticles is greater than or equal to about 480 nm (e.g., greater than or equal to about 500 nm).

The plurality of quantum dots may not include cadmium.

The ink composition may further include the monomer, the binder, and/or the initiator.

The plurality of quantum dots may include a core including a first semiconductor nanocrystal material and a shell disposed on the core and including a second semiconductor nanocrystal material, the second semiconductor nanocrystal material being different from the first semiconductor nanocrystal material, and the core may include a metal and a non-metal, the metal including indium, zinc, or a combination thereof, and the non-metal including phosphorous, selenium, tellurium, or a combination thereof, and the shell may include zinc, sulfur, and optionally selenium.

The plurality of quantum dots may have a maximum photoluminescent peak wavelength in a range of greater than or equal to about 500 nm and less than or equal to about 650 nm.

The plurality of quantum dots may have a quantum efficiency of greater than or equal to about 70%.

The luminous carbon particles may have a size (e.g., an average size) of greater than or equal to about 1 nm, for example, greater than or equal to about 2 nm, greater than or equal to about 3 nm, greater than or equal to about 4 nm, or greater than or equal to about 5 nm.

The luminous carbon particles may have a size (e.g., an average size) of less than or equal to about 10 nm, for example, less than or equal to about 9 nm, less than or equal to about 8 nm, less than or equal to about 7 nm, less than or equal to about 6 nm, or less than or equal to about 5 nm.

At least a portion of the plurality of luminous carbon nanoparticles may absorb light having a wavelength of greater than or equal to about 460 nm and a maximum luminous peak wavelength thereof may be greater than or equal to about 530 nm.

An amount of the plurality luminous carbon nanoparticles may be greater than or equal to about 1 part by weight and less than or equal to about 33 parts by weight, for example, greater than or equal to about 2 part by weight and less than or equal to about 15 parts by weight, with respect to 100 parts by weight of the plurality of quantum dots.

In some embodiments, a layered structure includes a substrate; and a luminescent layer disposed on the substrate and including a first repeating section configured to emit a first light and a second repeating section configured to emit a second light, the second light having a wavelength different from the wavelength of the first light, and at least one (for example, both) of the first repeating section and the second repeating section includes a plurality of quantum dots and a plurality of luminous carbon nanoparticles, wherein the plurality of quantum dots includes a Group II-VI compound, a Group III-V compound, a Group IV-VI compound, or a combination thereof, wherein the plurality of luminous carbon nanoparticles have a size (e.g., an average size) of less than or equal to about 10 nm, and exhibit both of a D band and a G band in a Raman spectrum thereof, and wherein at least a portion of the plurality of luminous carbon nanoparticles absorb light having a wavelength of greater than or equal to about 400 nm (e.g., greater than or equal to about 420 nm) and a maximum luminous peak wavelength is greater than or equal to about 480 nm (e.g., greater than or equal to about 500 nm).

The plurality of quantum dots and the plurality of luminous carbon nanoparticles may be dispersed in a polymer matrix.

The polymer matrix may include a carboxylic acid group-containing binder, a cross-linked polymerization product of a photopolymerizable monomer including a carbon-carbon double bond, or a combination thereof.

The second light may have a wavelength of greater than or equal to about 610 nm and less than or equal to about 640 nm.

The first light may have a wavelength of greater than or equal to about 500 nm and less than or equal to about 540 nm.

The plurality of quantum dots may not include cadmium.

The plurality of quantum dots may include a core including a first semiconductor nanocrystal material and a shell disposed on the core and including a second semiconductor nanocrystal material, the second semiconductor nanocrystal material being different from the first semiconductor nanocrystal material, and the first semiconductor nanocrystal material may include a metal and a non-metal, the metal including indium, zinc, or a combination thereof, and the non-metal including phosphorous, selenium, tellurium, or a combination thereof, and the second semiconductor nanocrystal material may include zinc, sulfur, and optionally selenium.

The plurality of luminous carbon nanoparticles may have a size (e.g., an average size) of greater than or equal to about 1 nm and less than or equal to about 5 nm.

In the Raman spectrum of the plurality of luminous carbon nanoparticles, an integral value of a D band may be greater than an integral value of a G band.

At least a portion of the plurality of luminous carbon nanoparticles may absorb light having a wavelength of greater than or equal to about 460 nm and a maximum luminous peak wavelength may be greater than or equal to about 530 nm.

An amount of the plurality of luminous carbon nanoparticles may be greater than or equal to about 1 part by weight (e.g., greater than or equal to about 2 parts by weight) and less than or equal to about 33 parts by weight (e.g., less than or equal to about 15 parts by weight), with respect to 100 parts by weight of the plurality of quantum dots.

The luminescent layer may have a thickness of greater than or equal to about 5 µm and less than or equal to about 10 µm, and an absorption rate of the luminescent layer with respect to light having a wavelength of 450 nm may be greater than or equal to about 90%.

In some embodiments, an electronic device (e.g., a display device) includes the aforementioned layered structure.

The electronic device may include a light emitting diode (LED), a sensor, an imaging sensor, a solar cell, or a liquid crystal display device.

The composition (e.g., the photosensitive composition or the ink composition) of the embodiments may provide a quantum dot polymer composite or a quantum dot pattern having enhanced optical properties (e.g., increased blue light absorption rate). The composition (e.g., the photosensitive composition or the ink composition) of the embodiments may be applied to a photolithography process or an ink-jet printing process. The quantum dot polymer composite or the quantum dot pattern prepared therefrom may find utility in various electronic devices or as a security medium, or may be used in a display device as a color conversion layer, contributing to improvement of color reproducibility of a device.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
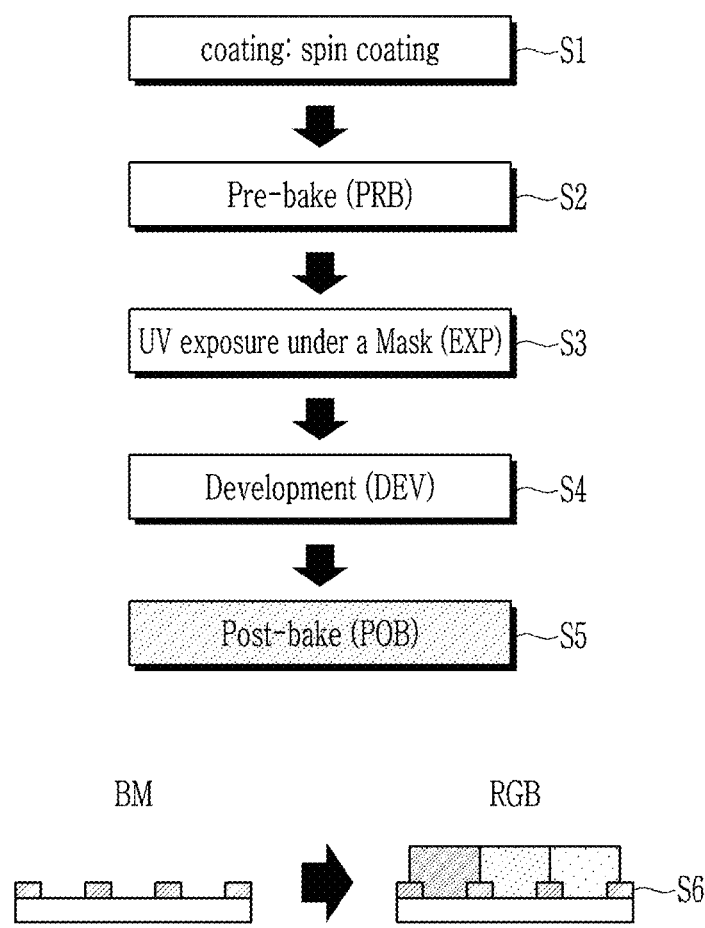
FIG. 1 is a schematic diagram illustrating a method of producing a quantum dot polymer composite pattern according to an exemplary embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, unless a definition is otherwise provided, the term "substituted" refers to a compound or a group or a moiety wherein at least one hydrogen atom thereof is substituted with a substituent. The substituent may include a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are the same or different, and are independently hydrogen or a C1 to C6 alkyl group), an azido group (—N$_3$), an amidino group (—O(=NH)NH$_2$), a hydrazino group (—NHNH$_2$), a hydrazono group (=N(NH$_2$), a group represented by the formula =N—R (wherein R is hydrogen or a C1 to C10 linear or branched alkyl group), an aldehyde group (—O(=O)H), a carbamoyl group (—C(O)NH$_2$), a thiol group (—SH), an ester group (—O(=O)OR, wherein R is a C1 to C6 alkyl group or a C6 to C12 aryl group), a carboxylic acid group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, unless a definition is otherwise provided, the term "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, unless a definition is otherwise provided, the term "hetero" means that the compound or group includes at least one (e.g., one to three) heteroatom(s), wherein the heteroatom(s) is each independently N, O, S, Si, or P.

As used herein, unless a definition is otherwise provided, the term "alkylene group" refers to a straight or branched chain, saturated aliphatic hydrocarbon group having a valence of at least two. The alkylene group may be optionally substituted with one or more substituents.

As used herein, unless a definition is otherwise provided, the term "arylene group" refers to a functional group having a valence of at least two and formed by the removal of at least two hydrogen atoms from one or more rings of an aromatic hydrocarbon, wherein the hydrogen atoms may be removed from the same or different rings (preferably different rings), each of which rings may be aromatic or nonaromatic. The arylene group may be optionally substituted with one or more substituents.

As used herein, unless a definition is otherwise provided, the term "aliphatic organic group" refers to a C1 to C30 linear or branched alkyl group, C2 to C30 linear or branched alkenyl group, and C2 to C30 linear or branched alkynyl group, the term "aromatic organic group" refers to a C6 to C30 aryl group or a C2 to C30 heteroaryl group, and the term "alicyclic organic group" refers to a C3 to C30 cycloalkyl group, a C3 to C30 cycloalkenyl group, and a C3 to C30 cycloalkynyl group.

As used herein, unless a definition is otherwise provided, the term "(meth)acrylate" refers to acrylate and/or methacrylate. The (meth)acrylate may include a (C1 to C10 alkyl)acrylate and/or a (C1 to C10 alkyl)methacrylate. "(Meth)acrylic" includes acrylic and/or methacrylic.

As used herein, the term "hydrophobic moiety" refers to a moiety that causes a compound including the same to agglomerate in an aqueous (hydrophilic) solution, and which has a tendency to repel water. For example, the hydrophobic moiety may include an aliphatic hydrocarbon group (e.g., alkyl, alkenyl, alkynyl, etc.) having at least one (e.g., at least two, three, four, five, or six, or higher) carbon atoms, an aromatic hydrocarbon group having at least six carbon atoms (e.g., phenyl, naphthyl, arylalkyl group, etc.), or an alicyclic hydrocarbon group having at least five carbon atoms (e.g., cyclohexyl, norbornenyl, etc.). The hydrophobic moiety may substantially lack the ability to form a hydrogen bond with a hydrophilic medium and may not be substantially mixed with the medium (e.g., a hydrophilic medium) as its polarity does not match that of the medium (e.g., a hydrophilic medium).

As used herein, unless a definition is otherwise provided, the term "dispersion" refers to a system in which a dispersed phase is a solid and a continuous phase includes a liquid. For example, the term "dispersion" may refer to a colloidal dispersion, wherein the dispersed phase includes particles having a dimension of about 1 nm to about several micrometers (μm) (e.g., 1 μm or less, 2 μm or less, or 3 μm or less).

As used herein, unless a definition is otherwise provided, the term "Group" in the term Group III, Group II, and the like refers to a group of the Periodic Table of Elements.

As used herein, "Group II" refers to Group IIA and a Group IIB, and examples of the Group II metal may include Cd, Zn, Hg, and Mg, but are not limited thereto.

As used herein, "Group III" refers to Group IIIA and Group IIIB, and examples of the Group III metal may include Al, In, Ga, and TI, but are not limited thereto.

As used herein, "Group IV" refers to Group IVA and Group IVB, and examples of the Group IV metal may include Si, Ge, and Sn but are not limited thereto. As used herein, the term "a metal" may include a semi-metal such as Si.

As used herein, "Group I" refers to Group IA and Group IB, and may include Li, Na, K, Rb, and Cs but are not limited thereto.

As used herein, "Group V" refers to Group VA and may include nitrogen, phosphorus, arsenic, antimony, and bismuth but is not limited thereto.

As used herein, "Group VI" refers to Group VIA and may include sulfur, selenium, and tellurium, but is not limited thereto.

When fabricated by colloidally synthesis, a quantum dot may have a relatively freely and uniformly controlled particle size. When the quantum dot has a predetermined size (e.g., a size of less than or equal to about 10 nm), it may show a quantum confinement effect wherein its bandgap increases as its size decreases. The quantum dot may achieve enhanced luminous efficiency and improved color reproducibility, for example, in various devices. To be applied in a device, the quantum dots may be dispersed in a host matrix (e.g., including a polymer and/or an inorganic material) to provide a quantum dot-polymer composite. For example, in order to be used in a display device, the quantum dots may be arranged in a pattern. A liquid crystal display (hereinafter, LCD) is a display in which polarized light passes through a layer of liquid crystals and expresses a color after passing through an absorptive color filter. A LCD may have drawbacks such as a narrow viewing angle and a low luminance due to low light transmittance of the absorptive color filter. Replacing the absorptive color filter with a photoluminescent-type color filter may make it possible for the display to have a wider viewing angle and an improved luminance. A color filter including the quantum dot-polymer composite contributes to realization of improved luminance and a wider viewing angle. A quantum dot pattern may find its utility in a photoluminescent-type color filter. However, unlike the absorption type color filter, a quantum dot pattern raises several technical limitations. For example, the quantum dot pattern having a limited thickness, also has a limited absorption rate of the excitation light (e.g., blue light) and the unabsorbed and unconverted blue light results in emission of a mixed color light in the pattern. In order to prevent such a mixed color light, each section of the pattern may include, for example, a filter (e.g., a blue cut filter) to prevent the passage or the transmission of the excitation light, which may in turn lead to a decrease in a luminous efficiency and an increase in a production cost. In order to increase the absorption rate of the excitation light in each section of the quantum dot pattern, an amount of the quantum dots may be increased, but the increase in the amount of quantum dots in the film having a limited thickness may result in a serious failure in a pattern forming process. Thus, there remains a need to develop a composition capable of providing a quantum dot pattern having an increased blue light absorption rate.

In an embodiment, a composition includes a plurality of quantum dots and a plurality of luminous carbon nanoparticles. As a photosensitive composition, the composition may also include a carboxylic acid group (—COOH)-containing binder; a photopolymerizable monomer having at least one carbon-carbon double bond; and a photoinitiator. As an ink composition, the composition may further include a liquid vehicle. In the composition of an embodiment, the plurality of quantum dots may be dispersed (for example, separately distributed from one another) by the carboxylic acid group (—COOH)-containing binder and/or the liquid vehicle to form a quantum dot dispersion. The quantum dot dispersion may include the carboxylic acid group (—COOH)-containing binder and the plurality of quantum dots dispersed in the carboxylic acid group (—COOH)-containing binder. The quantum dot dispersion may further include a solvent (e.g., an organic solvent).

The quantum dot (hereinafter also referred to as a semiconductor nanocrystal) may include a Group II-VI compound, a Group III-V compound, a Group IV-VI compound, or a combination thereof.

The Group II-VI compound may be selected from:
a binary element compound including CdSe, CdTe, ZnS, ZnSe, ZnTe, ZnO, HgS, HgSe, HgTe, MgSe, MgS, or a combination thereof;
a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and
a quaternary element compound including ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof.

The Group II-VI compound may further include a Group III metal.

The Group III-V compound may be selected from:
a binary element compound including GaN, GaP, GaAs, GaSb, AlN, AlP, AlAs, AlSb, InN, InP, InAs, InSb, or a combination thereof;
a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; and
a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

The Group III-V compound may further include a Group II metal. For example, the Group III-V compound including a Group II metal may be InZnP.

The Group IV-VI compound may be selected from:
a binary element compound including SnS, SnSe, SnTe, PbS, PbSe, PbTe, or a combination thereof;
a ternary element compound including SnSeS, SnSeTe, SnSTe, PbSeS, PbSeTe, PbSTe, SnPbS, SnPbSe, SnPbTe, or a combination thereof; and
a quaternary element compound including SnPbSSe, SnPbSeTe, SnPbSTe, or a combination thereof.

In some embodiments, the plurality of quantum dots do not include cadmium. In some embodiments, the plurality of quantum dots do not include copper (for example, in a core, a shell, or both). In some embodiments, the plurality of quantum dots do not include a zinc-copper-indium sulfide based semiconductor nanocrystal particle. In some embodiments, the plurality of quantum dots do not include zinc-indium sulfide based semiconductor nanocrystal particle.

The binary element compound, the ternary element compound, or the quaternary element compound may be respectively included in a uniform concentration in the quantum dot particle or may be present in partially different concentrations in the same quantum dot particle. The quantum dot may include a core including a first semiconductor nanocrystal and a shell disposed on at least a portion of a surface of the core and including a second semiconductor nanocrystal having a different composition from that of the first semiconductor nanocrystal. In some embodiments, the shell is disposed on the entire surface of the core. The core may include a metal and a mon-metal. The metal may include indium, zinc, or a combination thereof, and the non-metal may include phosphorous, selenium, tellurium, or a combination thereof. The shell may include zinc, sulfur, and optionally selenium. For example, the core may include a Group III-V compound (e.g., indium phosphide, InP) and the shell may include ZnS, ZnSeS, ZnSe, or a combination thereof. At an interface portion between the core and the shell, the concentration of an element (e.g., sulfur and/or selenium) present in the shell may have a concentration gradient that radially changes (e.g., decreases or increases)

toward the core. In addition, the shell may be a single layer or may be a multi-layered shell having at least two layers wherein adjacent layers have a different composition from each other. A layer of the shell may be a single composition or an alloy layer. The alloy layer may have a homogeneous composition or may include a gradient alloy.

In the quantum dot, the material(s) of the shell may have a energy bandgap that is different from the material(s) of the core. For example, the materials of the shell may have a energy bandgap that is larger than the energy bandgap of the core material. In other embodiments, the materials of the shell may have a energy bandgap that is smaller than the energy bandgap of the core material. In the case of the multi-layered shell, the energy bandgap of the outer layer material of the shell may be greater than the energy bandgaps of the core material and the inner layer material (a layer that is closer to the core) of the shell. In the case of the multi-layered shell, the energy bandgap of the outer layer material of the shell may be less than the energy bandgaps of the core material and the inner layer material (a layer that is closer to the core) of the shell. Absorption and light emitting wavelength of the quantum dot may be controlled by varying a composition and/or a size thereof.

A maximum photoluminescent peak wavelength of the quantum dot may be greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. A maximum photoluminescent peak wavelength of the quantum dot may be less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. A maximum photoluminescent peak wavelength of the quantum dot may be present in a range of about 500 nm to about 650 nm. A maximum photoluminescent peak wavelength of the green light emitting quantum dot may be present in a range of about 500 nm to about 550 nm, or about 500 nm to about 540 nm. A maximum photoluminescent peak wavelength of the red light emitting quantum dot may be present in a range of about 600 nm to about 650 nm or about 610 nm to about 640 nm.

The quantum dot may have a quantum efficiency of greater than or equal to about 60%, greater than or equal to about 70%, greater than or equal to about 80%, greater than or equal to about 90%, or even about 100%. For more improved color purity or color reproducibility, the quantum dot may have a relatively narrow value of full width at half maximum (FWHM). For example, the FWHM of the quantum dot may be less than or equal to about 50 nm, for example, less than or equal to about 45 nm, less than or equal to about 40 nm, less than or equal to about 35 nm, or less than or equal to about 30 nm.

As used herein, the term "size" refers to a particle diameter, or in the case of a non-spherically shaped particle, a dimension calculated from a two dimensional area of an scanning electron microscopic (SEM) image of the particle. The quantum dot may have a size of about 1 nm to about 100 nm. In some embodiments, the size (e.g., an average value thereof, i.e., the average size) of the quantum dot may be greater than or equal to about 2 nm, greater than or equal to about 3 nm, greater than or equal to about 4 nm, or greater than or equal to about 5 nm. The size (e.g., the average size) of the quantum dot may be less than or equal to about 50 nm, for example, less than or equal to about 45 nm, less than or equal to about 40 nm, less than or equal to about 35 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 10 nm, less than or equal to about 9 nm, less than or equal to about 8 nm, or less than or equal to about 7 nm. The shape of the quantum dot is not particularly limited. For example, the shape of the quantum dot may include a sphere, a polyhedron, a pyramid, a multi-pod, a cubic, a rectangular parallelepiped, a nanotube, a nanowire, a nanosheets, a nanorod, or a combination thereof, but is not limited thereto.

The quantum dot may be commercially available or may be synthesized by any method. In a colloidal synthesis, a particle size of the quantum dot may relatively easily controlled and a distribution in the size of quantum dot may be uniformly controlled. During the colloidal synthesis, precursors may react in an organic solvent to grow nanocrystal particles, and the organic solvent and/or a ligand compound may coordinated (or bound) to a surface of the quantum dot, thereby controlling the growth of the nanocrystal. Examples of the organic solvent and the ligand compound are known to those of skill in the art. After the synthesis, an extra, e.g., excess, amount of an organic compound (e.g., organic solvent and/or organic ligand) that is not coordinated (or bound) to a surface of the quantum dot may be removed by a re-precipitation process using an excess amount of a non-solvent. Examples of the non-solvent include acetone, ethanol, methanol, and the like, but are not limited thereto.

The quantum dot may include an organic ligand having a hydrophobic moiety. The organic ligand may be bound to a surface of the quantum dot. In an embodiment, the organic ligand may include RCOOH, $RNH_2$, $R_2NH$, $R_3N$, RSH, $R_3PO$, $R_3P$, ROH, RCOOR', $RPO(OH)_2$, RHPOOH, RHPOOH (wherein R and R' are the same or different, and are independently a hydrogen, C1 to C40 aliphatic hydrocarbon group, such as C1 to C40 or C3 to C24 alkyl or C2 to C40 or C3 to C24 alkenyl group or a C6 to C40 aromatic hydrocarbon group such as a C6 to C20 aryl group, or a combination thereof, provided that at least one R group in each ligand is not hydrogen), a polymeric organic ligand, or a combination thereof.

Examples of the organic ligand compound may include:
a thiol compound such as methane thiol, ethane thiol, propane thiol, butane thiol, pentane thiol, hexane thiol, octane thiol, dodecane thiol, hexadecane thiol, octadecane thiol, benzyl thiol;
an amine compound such as methylamine, ethylamine, propylamine, butylamine, pentylamine, hexylamine, octylamine, nonylamine, decylamine, dodecylamine, hexadecylamine, octadecylamine, dimethylamine, diethylamine, dipropylamine, tributylamine, trioctylamine, or a combination thereof;
a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, or a combination thereof;

a phosphine compound such as methyl phosphine, ethyl phosphine, propyl phosphine, butyl phosphine, pentyl phosphine, octyl phosphine, dioctyl phosphine, tributyl phosphine, trioctyl phosphine, or a combination thereof;

a phosphine oxide compound such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, trioctyl phosphine oxide, or a combination thereof;

diphenyl phosphine, triphenyl phosphine, or an oxide compound thereof, or a combination thereof;

a mono- or di(C5 to C20 alkyl)phosphinic acid such as mono- or dihexylphosphinic acid, mono- or dioctylphosphinic acid, mono- or didodecylphosphinic acid, mono- or di(tetradecyl)phosphinic acid, mono- or di(hexadecyl)phosphinic acid, mono- or di(octadecyl)phosphinic acid, or a combination thereof;

a C5 to C20 alkylphosphonic acid such as hexylphosphonic acid, octylphosphonic acid, dodecylphosphonic acid, tetradecylphosphonic acid, hexadecylphosphonic acid, octadecylphosphonic acid, or a combination thereof;

or a combination thereof.

In some embodiments, the quantum dot may further include a single organic ligand or may include a combination comprising at least one of the foregoing organic ligands. The hydrophobic organic ligand may not include a photopolymerizable moiety. The organic ligand may not have a photopolymerizable moiety such as a (meth)acrylate or a vinyl moiety for example at its terminal ends.

Examples of the organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, squalene, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) containing at least one (e.g., 1, 2, or 3) C6 to C22 alkyl group, a phosphine oxide (e.g., trioctylphosphine oxide) containing at least one (e.g., 1, 2, or 3) C6 to C22 alkyl group, a C12 to C22 aromatic ether such as a phenyl ether or a benzyl ether, or a combination thereof.

In some embodiments, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, greater than or equal to about 20 wt %, greater than or equal to about 21 wt %, greater than or equal to about 22 wt %, greater than or equal to about 23 wt %, greater than or equal to about 24 wt %, greater than or equal to about 25 wt %, greater than or equal to about 26 wt %, greater than or equal to about 27 wt %, greater than or equal to about 28 wt %, greater than or equal to about 29 wt %, or greater than or equal to about 30 wt %, based on the total amount of the composition. The amount of the quantum dot (e.g., having an organic ligand) may be less than or equal to about 75 wt %, for example, less than or equal to about 70 wt %, less than or equal to about 65 wt %, less than or equal to about 60 wt %, less than or equal to about 59 wt %, less than or equal to about 58 wt %, less than or equal to about 57 wt %, less than or equal to about 56 wt %, less than or equal to about 55 wt %, less than or equal to about 54 wt %, less than or equal to about 53 wt %, less than or equal to about 52 wt %, less than or equal to about 51 wt %, less than or equal to about 50 wt %, less than or equal to about 49 wt %, less than or equal to about 48 wt %, less than or equal to about 47 wt %, less than or equal to about 46 wt %, or less than or equal to about 45 wt %, based on the total amount of the composition.

The composition (e.g., the photosensitive composition or the ink composition) of the embodiments further includes a plurality of luminous carbon nanoparticles. As used herein, the term "luminous carbon nanoparticle" refers to a carbon particle that absorbs an excitation light of a predetermined wavelength and emits light having a wavelength longer than the wavelength of the excitation light. The "luminous carbon nanoparticle" may include a carbon dot, a graphene dot, or a combination thereof.

The plurality of luminous carbon nanoparticles in the composition may be present as separated from the aforementioned quantum dots (e.g., are present apart from or are not bound to the quantum dots).

A size (or an average value thereof) of the plurality of luminous carbon nanoparticles may be less than or equal to about 10 nm, for example, less than or equal to about 9 nm, less than or equal to about 8 nm, less than or equal to about 7 nm, less than or equal to about 6 nm, less than or equal to about 5 nm, less than or equal to about 4 nm, or less than or equal to about 3 nm. The size (or the average size) of the plurality of luminous carbon nanoparticles may be greater than or equal to about 1 nm, for example, greater than or equal to about 2 nm, greater than or equal to about 3 nm, greater than or equal to about 4 nm, or greater than or equal to about 5 nm. The composition of the embodiments includes the plurality of luminous carbon nanoparticles together with the aforementioned plurality of quantum dots and thereby a composite or a pattern prepared therefrom may exhibit greatly enhanced blue light absorption rate without any substantial increase of the inorganic content, thus capable of providing a desired patternability.

The plurality of luminous carbon nanoparticles may have crystallinity having a certain degree of defect. For example, the luminous carbon nanoparticles may be crystalline but at the same time include a greater amount of defects than graphite (i.e., a fully crystalline material). As the luminous carbon nanoparticles have such a predetermined crystallinity, they are different from an amorphous carbon material such as an active carbon. Thus, in an embodiment, the luminous carbon nanoparticles include both a D band and G band in their Raman spectrum. In the Raman spectrum of the luminous carbon nanoparticles, an integral value of the D band may be greater than an integral value of the G band.

At least a portion of the plurality of the luminous carbon nanoparticles may absorb (or be excited by) light having a wavelength of greater than or equal to about 400 nm, for example, greater than or equal to about 410 nm, greater than or equal to about 420 nm, greater than or equal to about 430 nm, greater than or equal to about 440 nm, greater than or equal to about 450 nm, greater than or equal to about 460 nm, greater than or equal to about 470 nm, greater than or equal to about 480 nm, greater than or equal to about 490 nm, greater than or equal to about 500 nm, greater than or equal to about 510 nm, greater than or equal to about 520 nm, greater than or equal to about 530 nm, or greater than or equal to about 540 nm, and less than or equal to about 560 nm, for example, less than or equal to about 550 nm or less than or equal to about 545 nm. The plurality of luminous carbon nanoparticles absorbing or being excited by the light may emit light having a maximum luminous peak wavelength of greater than or equal to about 480 nm, or for example, greater than or equal to about 490 nm, greater than or equal to about 500 nm, greater than or equal to about 510 nm, greater than or equal to about 515 nm, greater than or equal to about 520 nm, greater than or equal to about 525 nm, greater than or equal to about 530 nm, greater than or equal to about 535 nm, greater than or equal to about 540 nm, greater than or equal to about 545 nm, greater than or equal to about 550 nm, greater than or equal to about 555 nm, greater than or equal to about 560 nm, greater than or equal to about 565 nm, greater than or equal to about 570 nm, greater than or equal to about 575 nm, greater than or equal to about 580 nm, greater than or equal to about 585 nm, or greater than or equal to about 590 nm, and less than or equal to about 650 nm for example, less than or equal to about 640 nm, less than or equal to about 630 nm, less than or equal to about 620 nm, less than or equal to about 610 nm.

At least a portion of the plurality of luminous carbon nanoparticles may absorb light having a wavelength of greater than or equal to about 420 nm and the maximum luminous peak wavelength thereof may be greater than or equal to about 500 nm. At least a portion of the plurality of luminous carbon nanoparticles may absorb light having a wavelength of greater than or equal to about 420 nm and the maximum luminous peak wavelength thereof may be greater than or equal to about 510 nm. At least a portion of the plurality of luminous carbon nanoparticles may absorb light having a wavelength of greater than or equal to about 460 nm and the maximum peak wavelength thereof may be greater than or equal to about 530 nm.

The luminescent peak of the plurality of the luminous carbon nanoparticles may have a full with half maximum (FWHM). In some embodiments, the FWHM of the plurality of luminous carbon nanoparticles may be less than or equal to about 200 nm, less than or equal to about 190 nm, less than or equal to about 180 nm, less than or equal to about 170 nm, or less than or equal to about 160 nm. In some embodiments, the FWHM of the plurality of luminous carbon nanoparticles may be, greater than or equal to about 60 nm, for example, greater than or equal to about 70 nm, greater than or equal to about 80 nm, greater than or equal to about 90 nm, greater than or equal to about 100 nm.

The plurality of luminous carbon nanoparticles may be synthesized by any method or may be commercially available. In some non-limiting embodiments, the plurality of luminous carbon nanoparticles may be prepared by decomposing and carbonizing an organic material at a predetermined temperature and a predetermined pressure and crystallizing the same. For example, the plurality of luminous carbon nanoparticles may be prepared via a hydrothermal synthesis using water or a solvothermal synthesis using an organic solvent such as benzene. To facilitate the decomposition of the organic material, the synthesis may involve an oxidizing agent, a reducing agent, and/or a catalyst. Examples of the oxidizing agent include an inorganic acid such as a nitric acid, a sulfuric acid, a hydrogen peroxide, potassium permanganate, or a combination thereof, but is not limited thereto. Examples of the reducing agent may include a hydride such as, sodium borohydride ($NaBH_4$), potassium borohydride ($KBH_4$), $LiAlH_4$, $N_2H_4$, or a combination thereof, but are not limited thereto. Examples of the catalyst may include, but are not limited to, platinum, Pd, Ni, $TiO_2$, $Fe_2O_3$, or a combination thereof. The catalyst may be in a form of a nanoparticle.

The organic material that can be used for the synthesis of the plurality of luminous carbon nanoparticles is not particularly limited and may be selected appropriately. Examples of the organic material may include a plant derived material such as a sugar (e.g., glucose, fructose, or the like), starch, ascorbic acid, tartaric acid, glycolic acid, glycerin, citric acid, or a combination thereof. Examples of the organic material may also include a fatty acid such as oleic acid, an amino acid such as glutamine, or a C6 to C50 aromatic hydrocarbon such as benzene or toluene), acetylacetone, $C_6H_5C(O)CH_3$, acetic acid, or a combination thereof. A combination comprising at least one of the foregoing organic materials may also be used. Synthesis of the luminous carbon nanoparticles may be carried out in the aforementioned organic solvent in combination with the organic ligand. The organic ligand may be the organic ligand which is described above for the quantum dots. The organic ligand may coordinate to a surface of the luminous carbon nanoparticles.

A temperature for the synthesis of the plurality of luminous carbon nanoparticles may be selected appropriately and is not particularly limited. For example, the temperature of the synthesis may be greater than or equal to about 170° C., greater than or equal to about 180° C., greater than or equal to about 190° C., greater than or equal to about 200° C., greater than or equal to about 210° C., greater than or equal to about 220° C., greater than or equal to about 230° C., greater than or equal to about 240° C., and less than or equal to about 300° C., for example, less than or equal to about 290° C., less than or equal to about 280° C., or less than or equal to about 270° C. An appropriate synthesis (reaction) time may be selected. For example, a reaction time for synthesizing the plurality of luminous carbon nanoparticles may be greater than or equal to about 30 minutes, greater than or equal to about 40 minutes, greater than or equal to about 50 minutes, or greater than or equal to about 1 hour. A reaction time for synthesizing the plurality of luminous carbon nanoparticles may be less than or equal to about 5 hour, less than or equal to about 4 hour, or less than or equal to about 3 hour.

The plurality of luminous carbon nanoparticles may have a quantum efficiency of greater than or equal to about 10%, for example, greater than or equal to about 11%, greater than or equal to about 12%, greater than or equal to about 13%, greater than or equal to about 14%, greater than or equal to about 15%, greater than or equal to about 16%, greater than or equal to about 17%, greater than or equal to about 18%, greater than or equal to about 19%, or greater than or equal to about 20%. For example, the plurality of luminous carbon nanoparticles may have a quantum efficiency of less than or equal to about 45%, less than or equal to about 40%, less than or equal to about 35%, less than or equal to about 30%, or less than or equal to about 25%.

With respect to 100 parts by weight of the plurality of quantum dots, the amount of the plurality of luminous carbon nanoparticles may be greater than or equal to about 0.1 parts by weight, for example, greater than or equal to about 0.2 parts by weight, greater than or equal to about 0.3 parts by weight, greater than or equal to about 0.4 parts by weight, greater than or equal to about 0.5 parts by weight, greater than or equal to about 0.6 parts by weight, greater than or equal to about 0.6 parts by weight, greater than or equal to about 0.8 parts by weight, greater than or equal to about 0.9 parts by weight, greater than or equal to about 1 parts by weight, greater than or equal to about 1.1 parts by weight, greater than or equal to about 1.2 parts by weight, greater than or equal to about 1.3 parts by weight, greater than or equal to about 1.4 parts by weight, greater than or equal to about 1.5 parts by weight, greater than or equal to about 1.6 parts by weight, greater than or equal to about 1.7 parts by weight, greater than or equal to about 1.8 parts by weight, greater than or equal to about 1.9 parts by weight, greater than or equal to about 2 parts by weight, greater than or equal to about 3 parts by weight, greater than or equal to about 4 parts by weight, greater than or equal to about 5 parts by weight, greater than or equal to about 6 parts by weight, greater than or equal to about 7 parts by weight, greater than or equal to about 8 parts by weight, greater than or equal to about 9 parts by weight, or greater than or equal to about 10 parts by weight. With respect to 100 parts by weight of the plurality of quantum dots, the amount of the plurality of luminous carbon nanoparticles may be less than or equal to about 33 parts by weight, less than or equal to about 32 parts by weight, less than or equal to about 31 parts by weight, less than or equal to about 30 parts by weight, less than or equal to about 29 parts by weight, less than or equal to about 28 parts by weight, less than or equal to about 27 parts by weight, less than or equal to about 26 parts by weight, less than or equal to about 25 parts by weight, less than or equal to about 24 parts by weight, less than or equal to about 23 parts by weight, less than or equal to about 22 parts by weight, less than or equal to about 21 parts by weight, less than or equal to about 20 parts by weight, less than or equal to about 19 parts by weight, less than or equal to about 18 parts by weight, less than or equal to about 17 parts by weight, less than or equal to about 16 parts by weight, less than or equal to about 15 parts by weight, or less than or equal to about 14 parts by weight.

In some embodiments, with respect to 100 parts by weight of the plurality of quantum dots, the amount of the plurality of luminous carbon nanoparticles may be greater than or equal to about 1 parts by weight and less than or equal to about 33 parts by weight. In some embodiments, with respect to 100 parts by weight of the plurality of quantum dots, the amount of the plurality of luminous carbon nanoparticles may be greater than or equal to about 2 parts by weight and less than or equal to about 15 parts by weight.

In the composition, based on a total solids content, the amount of the plurality of luminous carbon nanoparticles may be greater than or equal to about 0.01% by weight, greater than or equal to about 1% by weight, greater than or equal to about 2% by weight, greater than or equal to about 3% by weight, greater than or equal to about 4% by weight, greater than or equal to about 5% by weight. In the composition, based on a total solids content, the amount of the plurality of luminous carbon nanoparticles may be less than or equal to about 25% by weight, less than or equal to about 20% by weight, less than or equal to about 15% by weight, or less than or equal to about 10% by weight.

The composition (e.g., the photosensitive composition) of the embodiments may further include a carboxylic acid group-containing binder. The carboxylic acid group-containing binder may contribute to the dispersability of the plurality of quantum dots in the composition.

The (e.g., photosensitive) composition according to an embodiment may be prepared by first dispersing the plurality of quantum dots, including an organic ligand (e.g., having a hydrophobic moiety) on a surface thereof, in a solution of the carboxylic acid group-containing binder having a hydrophobic moiety to obtain a quantum dot-binder dispersion. The obtained quantum dot-binder dispersion is then combined (mixed) with the other components (e.g., a (photo)polymerizable monomer, a (photo)initiator, and the like) to provide a photoresist. In the case of the photosensitive composition thus obtained, the plurality of quantum dots (for example, a relatively large amount of) may be well dispersed (e.g., individually distributed) in an alkaline developable photoresist without any significant aggregation. Without wishing to be bound by any theory, it is understood that when the quantum dots are dispersed in the solution of the carboxylic acid group-containing binder having a hydrophobic moiety, the binder may facilitate the formation of the dispersion including the plurality of quantum dots, and the plurality of quantum dots dispersed with the help of the binder, may maintain their dispersed state even when they constitute a photoresist composition. The photosensitive composition of the embodiments may be patterned via a developing process using an aqueous alkali developer. The photosensitive composition of the embodiments may not include an organic solvent such as N-methyl-2-pyrrolidone (NMP) or toluene during the development process of the pattern-.

The carboxylic acid group containing binder may include:
a copolymer of a monomer combination including a first monomer, a second monomer, and optionally a third monomer, the first monomer having a carboxylic acid group and a carbon-carbon double bond, the second monomer having a carbon-carbon double bond and a hydrophobic moiety and not having a carboxylic acid group, and the third monomer having a carbon-carbon double bond and a hydrophilic moiety and not having a carboxylic acid group;
a multi-aromatic ring-containing polymer including a carboxylic acid group (—COOH) and having a backbone structure in a main chain (e.g., a backbone structure incorporated in the main chain), wherein the backbone structure includes a cyclic group including a quaternary carbon atom and two aromatic rings bound to the quaternary carbon atom;
or a combination thereof.

The copolymer may include a first repeating unit derived from the first monomer, a second repeating unit derived from the second monomer, and optionally, a third repeating unit derived from the third monomer.

The first repeating unit may include a unit represented by Chemical Formula 1-1, a unit represented by Chemical Formula 1-2, or a combination thereof:

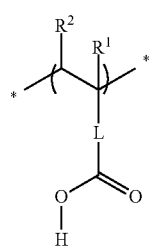

Chemical Formula 1-1 wherein, in Chemical Formula 1-1,
$R^1$ is hydrogen, a C1 to C3 alkyl group, or —$(CH_2)_n$—COOH (wherein n is 0 to 2),
$R^2$ is hydrogen, a C1 to C3 alkyl group, or —COOH,
L is a single bond, a C1 to C15 aliphatic hydrocarbon group such as a C1 to C3 alkylene group, a C6 to C30 aromatic hydrocarbon group such as a C6 to C12 arylene group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, and

* indicates a portion linked to an adjacent atom;

Chemical Formula 1-2

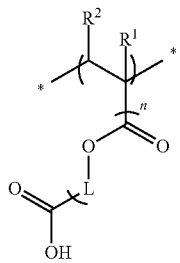

wherein, in Chemical Formula 1-2, $R^1$ is hydrogen, a C1 to C3 alkyl group, or —(CH$_2$)$_m$—COOH (wherein m is 0 to 2), $R^2$ is hydrogen or a C1 to C3 alkyl group, L is a single bond, a C1 to C15 alkylene group, a C1 to C15 alkylene group wherein at least one methylene group is replaced with —C(=O)—, —O—, —C(=O)O—, or a combination thereof, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, n is an integer of 1 to 3, and

* indicates a portion linked to an adjacent atom.

As used herein, examples of the C6 to C30 alicyclic group include a cycloalkyl group such as a cyclohexyl group and a norbornyl group, a cycloalkenyl group such as a norbornenyl group, a cycloalkylene group such as a cyclohexylene group and a norbornane moiety, and a cycloalkenylene group such as a cyclohexenylene group and a norbornene group, but are not limited thereto. As used herein, examples of the C6 to C30 aromatic hydrocarbon group includes a C6 to C30 aryl group such as a phenyl group, a naphthyl group, and the like, and a C6 to C30 arylene group such as a phenylene group, a naphthylene group, and the like, but are not limited thereto. As used herein, examples of the aliphatic hydrocarbon include for example C1 to C15 alkyl group and C1 to C15 alkylene group, but are not limited thereto.

The second repeating unit may include a unit represented by Chemical Formula 2, a unit represented by Chemical Formula 4, a unit represented by Chemical Formula 5, a unit represented by Chemical Formula A, or a combination thereof:

Chemical Formula 2

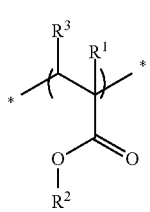

wherein in Chemical Formula 2, $R^1$ is hydrogen or a C1 to C3 alkyl group, $R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group (e.g., an arylalkyl group), $R^3$ is hydrogen or a C1 to C3 alkyl group, and

* indicates a portion linked to an adjacent atom;

Chemical Formula 4

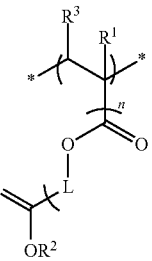

wherein in Chemical Formula 4, $R^1$ is hydrogen or a C1 to C3 alkyl group,

L is a C1 to C15 alkylene group, a C1 to C15 alkylene group wherein at least one methylene group is replaced with —C(=O)—, —O—, —C(=O)O—, or a combination thereof, a C6 to C30 aromatic hydrocarbon group such as C6 to C30 arylene group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^3$ is hydrogen or a C1 to C3 alkyl group, n is an integer of 1 to 3, and

* indicates a portion linked to an adjacent atom;

Chemical Formula 5

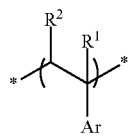

wherein in Chemical Formula 5, each of $R^1$ and $R^2$ is independently hydrogen or a C1 to C3 alkyl group, Ar is a substituted or unsubstituted C6 to C30 aromatic hydrocarbon group or a substituted or unsubstituted C3 to C30 alicyclic hydrocarbon group, and

* indicates a portion linked to an adjacent atom;

Chemical Formula A

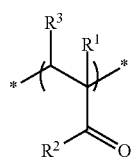

wherein in Chemical Formula A, $R^1$ is hydrogen or a C1 to C3 alkyl group, $R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^3$ is hydrogen or a C1 to C3 alkyl group, and

* indicates a portion linked to an adjacent atom.

The third repeating unit derived from the third monomer may be represented by Chemical Formula 3:

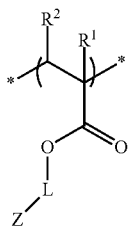

Chemical Formula 3 wherein in Chemical Formula 3, each of $R^1$ and $R^2$ is independently hydrogen or a C1 to C3 alkyl group, L is a C1 to C15 alkylene group, a C1 to C15 alkylene group wherein at least one methylene group is replaced with —C(=O)—, —O—, —C(=O)O—, or a combination thereof, a C6 to C30 aromatic hydrocarbon group such as a C6 to C30 arylene group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, Z is a hydroxyl group (—OH), a mercapto group (—SH), or an amino group (—NHR, wherein each R is independently hydrogen or a C1 to C5 alkyl group) and

* indicates a portion linked to an adjacent atom.

In some embodiments, in the binder copolymer, an amount of the first repeating unit derived from the first monomer may be greater than or equal to about 5 mole percent (mol %), for example, greater than or equal to about 10 mol %, greater than or equal to about 15 mol %, greater than or equal to about 25 mol %, or greater than or equal to about 35 mol %. In the binder copolymer, an amount of the first repeating unit may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder copolymer, an amount of the second repeating unit derived from the second monomer may be greater than or equal to about 5 mol %, for example, greater than or equal to about 10 mol %, greater than or equal to about 15 mol %, greater than or equal to about 25 mol %, or greater than or equal to about 35 mol %. In the binder copolymer, an amount of the second repeating unit may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder copolymer, an amount of the third repeating unit derived from the third monomer, when present, may be greater than or equal to about 1 mol %, for example, greater than or equal to about 5 mol %, greater than or equal to about 10 mol %, or greater than or equal to about 15 mol %. In the binder copolymer, an amount of the third repeating unit, when present, may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

In an embodiment, the carboxylic acid group-containing binder may include a copolymer of (meth)acrylic acid and at least one second or third monomer including an (C6-C9 aryl) or (C1-C10 alkyl)(meth)acrylate, hydroxyl(C1-C10 alkyl) (meth)acrylate, or styrene. For example, the binder polymer may include a (meth)acrylic acid/methyl (meth)acrylate copolymer, a (meth)acrylic acid/benzyl (meth)acrylate copolymer, a (meth)acrylic acid/benzyl (meth)acrylate/styrene copolymer, a (meth)acrylic acid/benzyl (meth)acrylate/2-hydroxy ethyl (meth)acrylate copolymer, a (meth)acrylic acid/benzyl (meth)acrylate/styrene/2-hydroxy ethyl (meth)acrylate copolymer, or a combination thereof.

In an embodiment, the carboxylic acid group containing binder may include a multi-aromatic ring-containing polymer. The multi-aromatic ring-containing polymer may include a carboxylic acid group (—COOH) and a main chain having a backbone structure incorporated therein, wherein the backbone structure includes a cyclic group including a quaternary carbon atom, which is a part of the cyclic group, and two aromatic rings bound to the quaternary carbon atom. The carboxylic acid group may be bonded to the main chain.

In the multi-aromatic ring-containing polymer, the backbone structure may include a repeating unit represented by Chemical Formula B

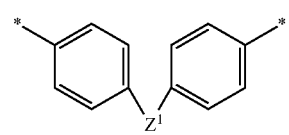

Chemical Formula B wherein in Chemical Formula B,

* indicates a portion that is linked to an adjacent atom in the main chain of the multi-aromatic ring-containing polymer, $Z^1$ is a linking moiety represented by any one of Chemical Formulae B-1 to B-6, and in Chemical Formulae B-1 to B-6, * indicates a portion that is linked to an adjacent atom in the aromatic ring:

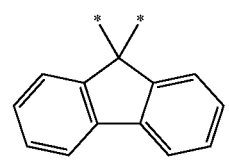

Chemical Formula B-1

-continued

Chemical Formula B-2

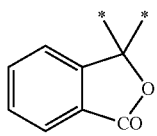

Chemical Formula B-3

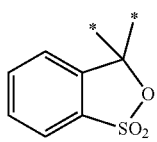

Chemical Formula B-4

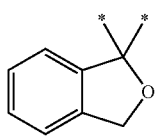

Chemical Formula B-5

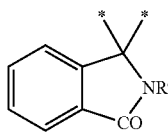

wherein in Chemical Formula B-5 $R^a$ is hydrogen, an ethyl group, $C_2H_4Cl$, $C_2H_4OH$, $CH_2CH=CH_2$, or a phenyl group, Chemical Formula B-6

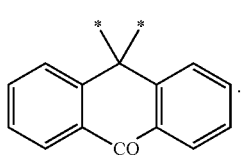

The multi-aromatic ring-containing polymer may include a structural unit represented by Chemical Formula C:

Chemical Formula C

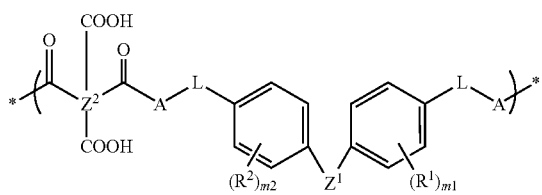

wherein in Chemical Formula C, $Z^1$ is a linking moiety represented by any one of Chemical Formulae B-1 to B-6, L is a single bond, a C1 to C10 alkylene, a C1 to C10 alkylene having a substituent including a carbon-carbon double bond, a C1 to C10 oxyalkylene, or a C1 to C10 oxyalkylene having a substituent including a carbon-carbon double bond, A is —NH—, —O—, a C1 to C10 alkylene, or a combination thereof, $Z^2$ is a C6 to C40 aromatic organic group, each of $R^1$ and $R^2$ is independently hydrogen, a halogen, or a substituted or unsubstituted C1 to C20 alkyl group, m1 and m2 are the same or different, and are independently an integer ranging from 0 to 4, and

* indicates a portion that is linked to an adjacent atom.

In Chemical Formula C, $Z^2$ may be Chemical Formula C-1, Chemical Formula C-2, or Chemical Formula C-3:

Chemical Formula C-1

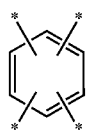

wherein * indicates a portion that is linked to an adjacent carbonyl carbon,

Chemical Formula C-2

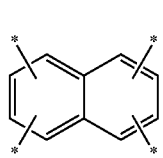

wherein * indicates a portion that is linked to an adjacent carbonyl carbon,

Chemical Formula C-3

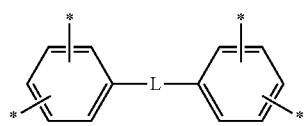

wherein in Chemical Formula C-3,

* indicates a portion that is linked to an adjacent carbonyl carbon,

L is a single bond, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR$_2$— (wherein each R is independently hydrogen, a C1 to C10 aliphatic hydrocarbon group, a C6 to C20 aromatic hydrocarbon group, or a C3 to C20 alicyclic hydrocarbon group), —C(CF$_3$)$_2$—, —C(CF$_3$)(C$_6$H$_5$)—, or —C(=O)NH—.

The multi-aromatic ring-containing polymer may include a structural unit represented by Chemical Formula D:

Chemical Formula D

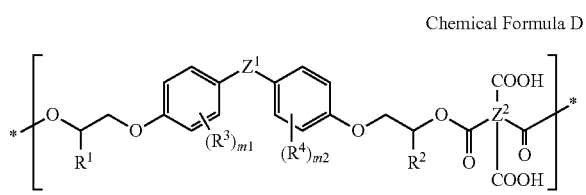

wherein in Chemical Formula D, each of $R^1$ and $R^2$ is independently hydrogen or a substituted or unsubstituted (meth)acryloyloxyalkyl group, each of $R^3$ and $R^4$ is independently hydrogen, a halogen, or a substituted or unsubstituted C1 to C20 alkyl group, $Z^1$ is a linking moiety represented by any of Chemical Formulae A-1 to A-6, $Z^2$ is a C6 to C40 aromatic organic group such as the moieties set forth above (e.g., the moieties represented by Chemical Formula C-1, C-2, or C-3), m1 and m2 are the same or different, and are independently an integer ranging from 0 to 4, and \* indicates a portion that is linked to an adjacent atom.

In some embodiments, the multi-aromatic ring-containing polymer may be an acid adduct of a bisphenol fluorene epoxy acrylate monomer. For example, the bisphenol fluorene epoxy acrylate may be prepared by reacting 4,4-(9-fluorenylidene)-diphenol and epichlorohydrin to obtain an epoxy compound having a fluorene moiety, and the epoxy compound having a fluorene moiety is reacted with an acrylic acid to obtain a fluorenyl epoxy acrylate, which is then further reacted with biphenyl dianhydride and/or phthalic anhydride (e.g., tetrahydrophthalic anhydride). The aforementioned reaction scheme may be summarized as below:

The multi-aromatic ring-containing polymer may include a functional group represented by Chemical Formula E at one or both terminal ends:

Chemical Formula E wherein in Chemical Formula E

\* indicates a portion that is linked to an adjacent atom, and $Z^3$ is a moiety represented by one of Chemical Formulae E-1 to E-7:

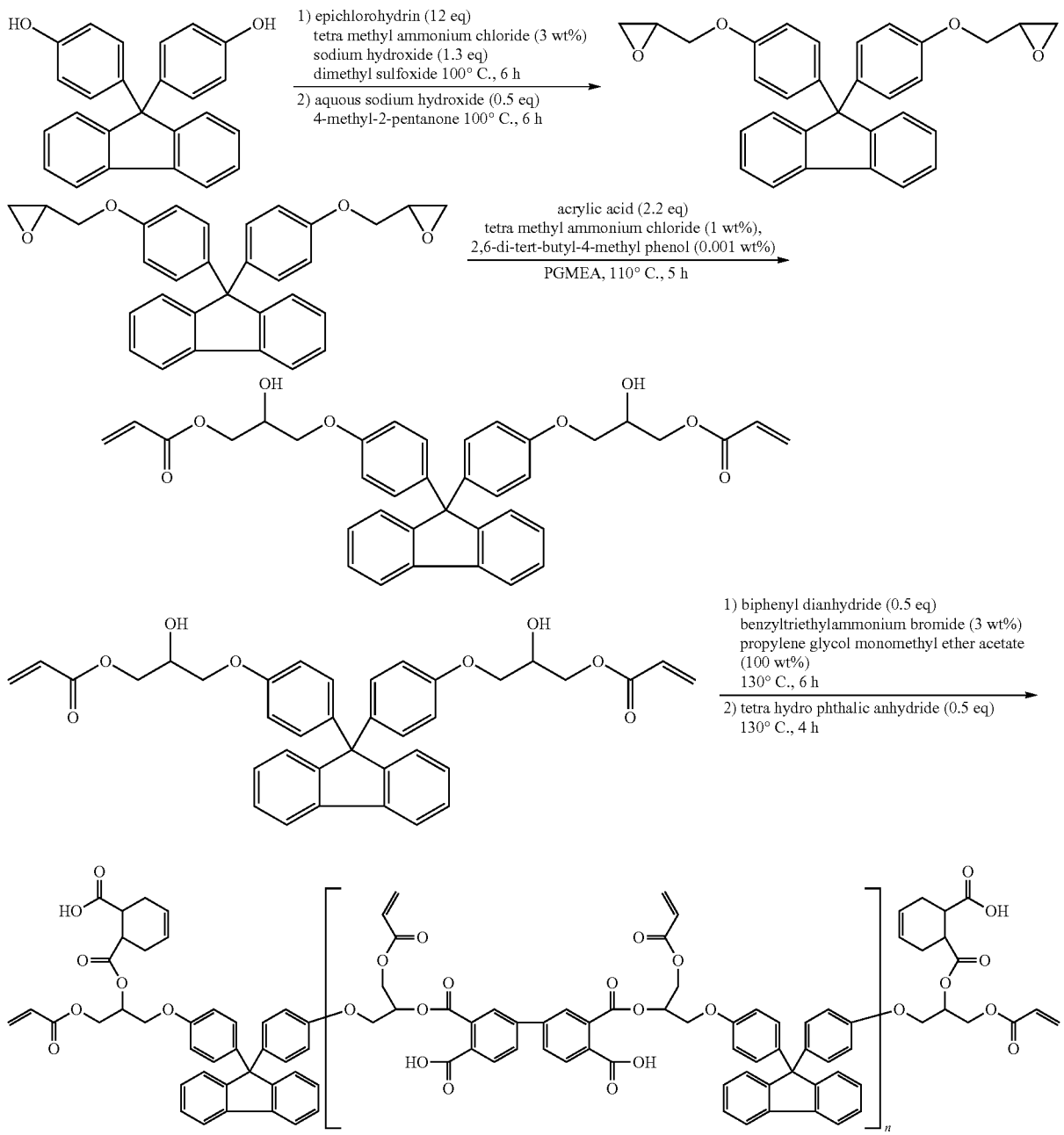

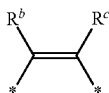

Chemical Formula E-1 wherein in Chemical Formula E-1, each of $R^b$ and $R^c$ is independently hydrogen, a substituted or unsubstituted C1 to C20 alkyl group, a substituted or unsubstituted C1 to C20 alkyl group wherein at least one methylene is replaced with an ester group, an ether group, or a combination thereof, and
* indicates a portion that is linked to an adjacent atom;

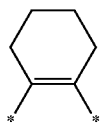

Chemical Formula E-2

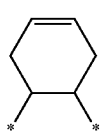

Chemical Formula E-3

Chemical Formula E-4

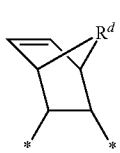

Chemical Formula E-5 wherein in Chemical Formula E-5 $R^d$ is O, S, NH, a substituted or unsubstituted C1 to C20 alkylene group, a C1 to C20 alkylamine group, or a C2 to C20 alkenylamine group;

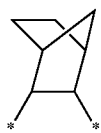

Chemical Formula E-6

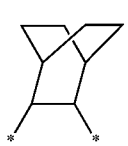

Chemical Formula E-7

The multi-aromatic ring-containing polymer may be synthesized by a known method or is commercially available (e.g., from Nippon Steel Chemical Co., Ltd.).

As non-limiting examples, the multi-aromatic ring-containing polymer may include a structural unit derived from a reaction product of a fluorene compound such as 9,9-bis(4-hydroxyphenyl)fluorene, 9,9-bis(4-aminophenyl)fluorene, 9,9-bis[4-(glycidyloxy)phenyl]fluorene, 9,9-bis[4-(2-hydroxyethoxy)phenyl]fluorene, 9,9-bis-(3,4-dicarboxyphenyl)fluorene dianhydride, or a combination thereof, with an appropriate compound capable of reacting with the fluorene compound. The appropriate compound capable of reacting with the fluorene compound may include, but is not limited to, an aromatic dianhydride such as pyromellitic dianhydride (PMDA), biphenyltetracarboxylic dianhydride (BPDA), benzophenone tetracarboxylic dianhydride, and naphthalene tetracarboxylic dianhydride; a C2 to C30 diol compound; epichlorohydrin, or a combination thereof.

The fluorene compound, the dianhydrides, the diol compound, and the like are commercially available, and the reaction conditions therebetween may be determined by those of skill in the art without undue experimentation.

The binder polymer (e.g., containing the carboxylic acid group, such as the carboxylic acid group-containing binder) may have a molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a molecular weight of less than or equal to about 100,000 g/mol, for example, less than or equal to about 90,000 g/mol, less than or equal to about 80,000 g/mol, less than or equal to about 70,000 g/mol, less than or equal to about 60,000 g/mol, less than or equal to about 50,000 g/mol, less than or equal to about 40,000 g/mol, less than or equal to about 30,000 g/mol, less than or equal to about 20,000 g/mol, or less than or equal to about 10,000 g/mol. The carboxylic acid group-containing binder having the molecular weight of the aforementioned range may guarantee the developability of the photoresist composition.

The carboxylic acid group-containing binder may have an acid value of greater than or equal to about 50 mg KOH/g. For example, the carboxylic acid group-containing binder may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g, but is not limited thereto. The carboxylic acid group-containing binder may have an acid value of less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto.

In the composition, if present, an amount of the carboxylic acid group-containing binder may be greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, or greater than or equal to about 20 wt %, based on the total weight of solids (i.e., non-volatiles) in the composition. In an embodiment, an amount of the carboxylic acid group-containing binder may be less than or equal to about 70 wt %, for example, less than or equal to about 65 wt %, less than or equal to about 60 wt %, less than or equal to about 59 wt %, less than or equal to about 58 wt %, less than or equal to about 57 wt %, less than or equal to about 56 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 29 wt %, less than or equal to about 28 wt %, less than or equal to about 27 wt %, less than or equal to about 26 wt %, less than or equal to about 25 wt %, less than or equal to about 24 wt %, less than or equal to about 23 wt %, less than or equal to about 22 wt %, or less than or equal to about 21 wt %, based on the total weight of solids (i.e., non-volatiles) in the composition. The aforementioned amount of the carboxylic acid group-containing binder may be controlled in order to ensure dispersibility of the quantum dots and achieve an appropriate level of developing and process properties.

The composition according to an embodiment may include a photopolymerizable monomer having at least one (e.g., two, three, four, five, six, seven, or more) carbon-carbon double bond (e.g., an acrylate group or a methacrylate group). Types of the photopolymerizable monomer are not particularly limited as long as they include a carbon-carbon double bond and may be polymerized by light. For example, the photopolymerizable monomer may be a monomer or an oligomer that may be used in a photosensitive composition. The photopolymerizable monomer may include a monofunctional or multi-functional ester of (meth) acrylic acid having at least one ethylenic unsaturated double bond. For example, the photopolymerizable monomer may include a vinyl monomer, an unsaturated ethylenic oligomer, a homopolymer thereof, a copolymer of the unsaturated ethylenic oligomer and an ethylenic unsaturated monomer, or a combination thereof. The photopolymerizable monomer may include a hyperbranched oligomer having at least eight (8) (meth)acrylate groups.

Examples of the photopolymerizable monomer may include, but are not limited to, C1-C10-alkyl (meth)acrylate, ethylene glycol di(meth)acrylate, triethylene glycol di(meth) acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth) acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy (meth)acrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof. The photopolymerizable monomer of the embodiments may include a di(meth) acrylate compound, a tri(meth)acrylate compound, a tetra (meth)acrylate compound, a penta(meth)acrylate compound, a hexa(meth)acrylate compound, or a combination thereof.

In the composition, if present, the amount of the (photo) polymerizable monomer may be greater than or equal to about 1 wt %, for example, greater than or equal to about 2 wt %, or greater than or equal to about 3 wt % with respect to a total solids content of the composition. The amount of the photopolymerizable monomer may be less than or equal to about 70 wt %, for example, less than or equal to about 65 wt %, less than or equal to about 60 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, or less than or equal to about 10 wt % with respect to a total solids content of the composition.

In some embodiments, the composition may further include a multi-thiol compound having at least two thiol groups (e.g., at its terminal ends). The multi-thiol compound may include a compound represented by Chemical Formula 6:

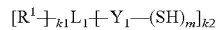   Chemical Formula 6 wherein $R^1$ includes hydrogen, a substituted or unsubstituted C1 to C40 (or C1 to C30) linear or branched alkyl group, a C2 to C40 (or C2 to C30) linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —$NH_2$, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group), or a combination thereof, $L_1$ includes a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C2 to C30 heterocycloalkylene group, wherein at least one methylene (—$CH_2$—) of the substituted or unsubstituted C1 to C30 alkylene group or the substituted or unsubstituted C2 to C30 alkenylene group may be replaced by a sulfonyl group (—S(=O)$_2$—), a carbonyl group (—O(=O)—), an ether group (—O—), a sulfide group (—S—), a sulfoxide group (—S(=O)—), an ester group (—O(=O)O—), an amide group (—O(=O)NR—) (wherein R is hydrogen or a C1 to C10 alkyl group), or a combination thereof, $Y_1$ includes a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group in which at least one methylene (—$CH_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), imine group (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of $Y_1$ when $Y_1$ is not a single bond, and provided that the sum of k1 and k2 does not exceed the valence of $L_1$.

The multi-thiol compound may include a compound of Chemical Formula 6-1:

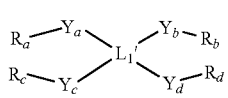

Chemical Formula 6-1 wherein in Chemical Formula 6-1, $L_1'$ is carbon, a substituted or unsubstituted C2 to C20 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_a$ to $Y_d$ are the same or different, and are independently a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group in which at least one methylene (—CH$_2$—) is replaced with a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), an imine group (—NR—) (wherein R is hydrogen or a C1 to C10 linear or branched alkyl group), or a combination thereof, and each of $R_a$ to $R_d$ is independently $R^1$ of Chemical Formula 6 or SH, provided that at least two of $R_a$ to $R_d$ are SH.

The multi-thiol compound may include a dithiol compound, a trithiol compound, a tetrathiol compound, or a combination thereof. For example, the multi-thiol compound may include glycol di-3-mercaptopropionate (e.g., ethylene glycol di-3-mercaptopropionate), glycol dimercaptoacetate (e.g., ethylene glycol di mercaptoacetate), trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

In the composition of the embodiments, if present, the amount of the multi-thiol compound may be greater than or equal to about 0.5 wt %, for example, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt %, based on a total solids content of the composition. Based on a total solids content of the composition, the amount of the multi-thiol compound may be less than or equal to about 55 wt %, for example, less than or equal to about 50 wt %, less than or equal to about 40 wt %, less than or equal to about 35 wt %, less than or equal to about 30 wt %, or less than or equal to about 27 wt %. The amount of the multi-thiol compound may be controlled in light of desired patternability and stability of the composition.

The composition of the embodiments may further include an initiator (e.g., a thermal initiator or a photoinitiator). Types of the initiator are not particularly limited and may be selected appropriately. For example, the initiator may be a photo-initiator and may include a triazine compound, an acetophenone compound, a benzophenone compound, a thioxanthone compound, a benzoin compound, an oxime compound, an aminoketone compound, a phosphine or phosphine oxide compound, a carbazole compound, a diketone compound, a sulfonium borate compound, a diazo compound, a diimidazole compound, or a combination thereof, but it is not limited thereto.

In a non-limiting example, examples of the triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxy phenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, 2,4-bis(trichloromethyl)-6-styryl-s-triazine, 2-(naphth-1-yl)-4,6-bis(trichloromethyl)-s-triazine, 2-(4-methoxynaphth-1-yl)-4,6-bis(trichloromethyl)-s-triazine, 2,4-bis(trichloromethyl)-6-(piperonyl)-s-triazine, 2,4-bis(trichloromethyl)-6-(4'-methoxy styryl)-s-triazine, or a combination thereof, but are not limited thereto.

Examples of the acetophenone compound may include 2,2'-diethoxyacetophenone, 2,2'-dibutoxyacetophenone, 2-hydroxy-2-methylpropiophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-di methylamino-1-(4-morpholinophenyl)-butan-1-one, or a combination thereof, but are not limited thereto.

Examples of the benzophenone compound may include benzophenone, benzoyl benzoate, methyl benzoyl benzoate, 4-phenylbenzophenone, hydroxybenzophenone, acrylated benzophenone, 4,4'-bis(dimethylamino)benzophenone, 4,4'-dichlorobenzophenone, 3,3'-dimethyl-2-methoxybenzophenone, or a combination thereof, but are not limited thereto.

Examples of the thioxanthone compound may include thioxanthone, 2-methylthioxanthone, 2-isopropylthioxanthone, 2,4-diethylthioxanthone, 2,4-2-chlorothioxanthone, or a combination thereof, but are not limited thereto.

Examples of the benzoin compound may include benzoin, benzoin methyl ether, benzoin ethyl ether, benzoin isopropyl ether, benzoin isobutyl ether, benzyl dimethyl ketal, or a combination thereof, but are not limited thereto.

Examples of the oxime compound may include 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, or a combination thereof, but are not limited thereto.

As an alternative to, or in addition to the foregoing photoinitiators, a carbazole compound, a diketone compound, a sulfonium borate compound, a azo compound (e.g., diazo compound), a biimidazole compound, or a combination thereof may be used as a photoinitiator.

In the composition of the embodiments, an amount of the initiator may be greater than or equal to about 0.05 wt %, for example, greater than or equal to about 0.1 wt %, or greater than or equal to about 1 wt %, based on a total solid content (i.e., the non-volatiles) of the composition. The amount of the photoinitiator may be less than or equal to about 15 wt %, for example, less than or equal to about 12 wt %, or less than or equal to about 5 wt % based on the total solid content of the composition.

The photosensitive composition of the embodiments may further include a metal oxide particle, in particular a plurality of metal oxide particles.

The metal oxide particle may also be referred to herein as "a metal oxide fine particle" due to a relatively small, or "fine" (average) particle size. An average particle size of the metal oxide fine particle may be greater than or equal to about 30 nm, for example, greater than or equal to about 100 nm, greater than or equal to about 150 nm, greater than or equal to about 160 nm, greater than or equal to about 170 nm, greater than or equal to about 180 nm, or greater than or equal to about 190 nm. An average particle size of the metal oxide fine particle may be less than or equal to about 1,000 nm, less than or equal to about 900 nm, less than or equal to about 800 nm, less than or equal to about 700 nm, less than or equal to about 600 nm, or less than or equal to about 500 nm. An average size of the metal oxide particle may be from about 100 nm to about 500 nm or from about 190 nm to about 450 nm. The average particle size of the metal oxide fine particle may be selected considering the amounts of other components, a desired thickness of the composite, and the like.

The metal oxide fine particle may include a titanium oxide, a silicon oxide, a barium oxide, a zinc oxide, or a combination thereof. For example, the metal oxide fine particle may include $TiO_2$, $SiO_2$, $BaTiO_3$, $Ba_2TiO_4$, ZnO, or a combination thereof.

An amount of the metal oxide fine particle may be greater than or equal to about 0.01 wt %, for example, greater than or equal to about 0.05 wt %, greater than or equal to about 0.1 wt %, greater than or equal to about 0.5 wt %, greater than or equal to about 1 wt %, or greater than or equal to about 1.5 wt %, based on a total weight of the composition. An amount of the metal oxide fine particle may be less than or equal to about 50 wt %, for example, less than or equal to about 45 wt %, less than or equal to about 30 wt %, less than or equal to about 25 wt %, or less than or equal to about 20 wt %, based on a total weight of the composition.

Based on a total solid content (TSC), an amount of the metal oxide fine particle may be greater than or equal to about 0.5 wt %, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt %. Based on a total solid content (TSC), an amount of the metal oxide fine particle may be less than or equal to about 60 wt %, less than or equal to about 50 wt %, less than or equal to about 40 wt %, or less than or equal to about 35 wt %.

When the metal oxide fine particle has a particle size and amounts in the above-described ranges of the particle size and the amount, the metal oxide fine particle may further enhance the luminous properties of a quantum dot polymer composite (or a pattern thereof) prepared from the photosensitive composition.

Optionally, the photosensitive composition may further include various additives such as a light diffusing agent, a leveling agent, or a coupling agent, in addition to the aforementioned components. The amount of the additive is not particularly limited, and may be selected within an appropriate range by the person of skill in the art, wherein the additive does not cause an adverse effect on the preparation of the composition, the preparation of the quantum dot polymer composite, and optionally, the patterning of the composite. If present, the amount of the additive(s) may be greater than or equal to about 0.001 wt %, and less than or equal to about 20 wt %, based on a total weight of the composition, but it is not limited thereto.

The leveling agent may prevent stains or spots and may improve planarization and leveling characteristics of a film. Examples of the leveling agent may include the following but are not limited thereto.

For example, the leveling agent may include a fluorine-containing leveling agent and may include commercial products, for example BM-1000® and BM-1100® of BM Chemie Inc.; MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.; and SH-28PA®, SH-190®, SH-193®, SZ-6032®, SF-8428®, and the like of Toray Silicone Co., Ltd.

The coupling agent may increase adhesion with respect to the substrate, and an example thereof may include a silane coupling agent. Examples of the silane coupling agent may be vinyl trimethoxysilane, vinyl tris(2-methoxyethoxysilane), 3-glycidoxypropyltrimethoxysilane, 2-(3,4-epoxycyclohexyl)ethyltrimethoxysilane, 3-chloropropylmethyldimethoxysilane, 3-chloropropyltrimethoxysilane, 3-methacryloxylpropyltrimethoxysilane, 3-mercaptopropyltrimethoxysilane, or a combination thereof. Types and the amounts of the additive(s) may be adjusted, as desired.

The composition (e.g., the photosensitive composition or the ink composition) of the embodiments described herein includes a solvent (e.g., organic solvent) or a liquid vehicle. The solvent may be included in the quantum dot binder dispersion. In some embodiments, the nanomaterials included in the composition (e.g., the ink composition) such as the plurality of quantum dots and the plurality of luminous carbon nanoparticles may be selected in light of the types of the nanomaterials and the desired properties of the deposited nanomaterials, for example, a thickness of the deposited nanomaterials, an optical density, a feature (e.g., patterned or non-patterned, a size of the pattern), or a combination thereof. The amount of the solvent or the liquid vehicle in the composition may be adjusted so that a concentration of the solid content of the composition may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, or greater than or equal to about 20 wt %. The amount of the solvent or the liquid vehicle in the composition may be adjusted so that a concentration of the solid content of the composition may be less than or equal to about 50 wt %, for example, less than or equal to about 45 wt %, less than or equal to about 40 wt %, or less than or equal to about 30 wt %.

The type and the amount of the solvent may be determined depending on the type of the composition, the amounts of each of the components (i.e., the carboxylic acid group-containing binder, the plurality of quantum dots and/or the plurality of luminous carbon nanoparticles), and the affinity therewith. The liquid vehicle may include an organic non-polar solvent. The liquid vehicle may have a viscosity of less than or equal to about 1 centipoise (cP) and a relatively high volatility.

Non-limiting examples of the solvent and the liquid vehicle may include, but are not limited to: ethyl 3-ethoxy propionate; an ethylene glycol such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, and diethylene glycol dimethyl ether; glycol ether acetates such as ethylene glycol monomethyl ether acetate, ethylene glycol monoethyl ether acetate, diethylene glycol monoethyl ether acetate, and diethylene glycol monobutyl ether acetate; a propylene glycol such as propylene glycol; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, and dipropylene glycol diethyl ether; a propylene glycol ether acetate such as propylene glycol monomethyl ether acetate and dipropylene glycol monoethyl ether acetate; an amide such as N-methylpyrrolidone, dimethyl formamide, and dimethyl acetamide; a ketone such as methyl ethyl ketone (MEK), methyl isobutyl ketone (MIBK), and cyclohexanone; a petroleum product such as toluene, xylene, and solvent naphtha; an ester such as ethyl acetate, propyl acetate, butyl acetate, cyclohexyl acetate, and ethyl lactate; an ether such as diethyl ether, dipropyl ether, and dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, and the like), a C6 to C40 aromatic hydrocarbon (e.g., toluene, xylene, and the like), a halogen (e.g., chloro) substituted C6 to C40 aromatic hydrocarbon, or a combination thereof.

In addition to the quantum dots, the luminous carbon nanoparticles, and the liquid vehicle, and optionally the monomer and/or the binder, an ink composition of the embodiments may further include an additive such as a surfactant, a solvent, a co-solvent, a buffer, a biocide, a viscosity modifier, a complexing agent, a chelating agent, a stabilizing agent (e.g., to inhibit agglomeration of the nanomaterial), a humectant, a filler, an extender, or a combination thereof. Types and amounts of the additives may be appropriately selected and are not particularly limited. In the ink composition, the amount of the quantum dots and the amount of the luminous carbon particles, and optionally the amount of the monomer and/or the binder are the same as set forth above. In the ink composition, the amount of the liquid vehicle may be selected appropriately in light of a total solid content and desired properties (e.g., concentration/viscosity) of the composition and is not particularly limited.

In some embodiments, the photosensitive composition may be prepared by a method that includes: preparing a binder solution including the carboxylic acid group-containing binder and a solvent; preparing a quantum dot binder dispersion including the plurality of quantum dots and the binder solution; and combining the quantum dot binder dispersion with other components, such as the photoinitiator, the photopolymerizable monomer, the multi-thiol compound, and optionally, at least one of the foregoing additives. The plurality of luminescent carbon nanoparticles may be included in (or added separately to) the quantum dot binder dispersion and/or the binder solution, or may be added at any step in combination with any of the other components, and it is not limited thereto. A combining manner is not particularly limited, and may be appropriately selected. For example, each component may be combined sequentially or simultaneously.

The method may further include providing (e.g., selecting) a plurality of quantum dots including an organic ligand bonded to the surface, and providing a binder capable of dispersing the quantum dots (e.g., a carboxylic acid group-containing binder). In the step of providing the binder, a chemical structure and an acid value of the binder may be considered.

In some embodiments, the ink composition may be prepared by dispersing, mixing and/or combining the quantum dots and the luminous carbon nanoparticles in the liquid vehicle (and/or the carboxylic acid group containing binder), optionally together with the additional components described above. A dispersing/mixing/combining manner is not particularly limited, and may be appropriately selected. For example, each component may be combined sequentially or simultaneously.

A composition (e.g., a photosensitive composition or an ink composition) according to an embodiment may provide a quantum dot polymer composite or a quantum dot pattern. In an embodiment, the photosensitive composition may undergo a photopolymerization to provide a quantum dot polymer composite.

In an embodiment, a quantum dot polymer composite may include a polymer matrix; and a plurality of quantum dots and a plurality of luminous carbon nanoparticles being dispersed in the polymer matrix. The plurality of quantum dots and the plurality of luminous carbon nanoparticles are dispersed in the polymer matrix so as to be separate from each other. The polymer matrix may include a carboxylic acid group-containing binder; a cross-linked polymerization product of a photopolymerizable monomer including a carbon-carbon double bond; or a combination thereof. In embodiments, the quantum dot polymer composite may include a polymer matrix including a thiolene polymer, a (meth)acrylate polymer, a urethane polymer, an epoxy polymer, a vinyl polymer, a silicone polymer, or a combination thereof. In some embodiments, the polymer matrix include a linear polymer and/or a crosslinked polymer. Details of the components (e.g., the plurality of quantum dots, the plurality of luminous carbon nanoparticles, the carboxylic acid group-containing binder, the photopolymerizable monomer, and the like) are the same as set forth above.

Based on a total weight of the quantum dot polymer composite, an amount of the polymer matrix may be greater than or equal to about 1 wt % and less than or equal to about 75 wt %, an amount of the plurality of the quantum dots may be greater than or equal to about 1 wt % and less than or equal to about 75 wt %, and an amount of the plurality of luminous carbon nanoparticles may be greater than or equal to about 0.01 wt % and less than or equal to about 25 wt %. The quantum dot polymer composite may be a film having a thickness of greater than or equal to about 5 µm, greater than or equal to about 6 µm, or greater than or equal to about 7 µm and less than or equal to about 10 µm, less than or equal to about 9 µm, or less than or equal to about 8 µm. An absorption rate of the quantum dot polymer composite with respect to light having a wavelength of 450 nm (hereinafter, also referred to as excitation light) may be greater than or equal to about 80%, greater than or equal to about 81%, greater than or equal to about 82%, or greater than or equal to about 83%. As used herein, the absorption rate (%) may be defined by the following equation:

Absorption rate (%)={1−(B'/B)}×100%

B': amount of the excitation light passing through the composite

B: total amount of the excitation light

The quantum dot-polymer composite may be patterned. A non-limiting method of forming a pattern of the quantum dot polymer composite is explained with reference to FIG. 1.

First, the composition of the embodiment is coated on a predetermined substrate (e.g., a glass substrate or a glass substrate coated with a protective layer (e.g., $SiN_x$) having a predetermined thickness (e.g., of about 500 to 1,500 Angstroms (Å)) in an appropriate manner such as spin coating, slit coating, and the like to form a film of a predetermined thickness (e.g., a thickness of greater than or equal to about 5 μm and less than or equal to about 30 μm)(S1). If desired, the formed film may be pre-baked for example at a temperature around the boiling point of the used organic solvent (S2). Conditions (such as a temperature, a duration, and an atmosphere) for the pre-baking may be selected appropriately. The formed (and optionally, pre-baked) film is exposed to light of a predetermined wavelength (UV light) under a mask having a predetermined pattern (S3). The wavelength and the intensity of light may be selected depending on the types and the amounts of the photoinitiator, the types and the amounts of quantum dots, or the like.

The film having the exposed selected area is treated (e.g., sprayed or immersed) with an alkali developing solution (S4), and thereby the unexposed region in the film is dissolved to provide a desired pattern. The obtained pattern may be post-baked (S5), if desired, to improve crack resistance and solvent resistance of the pattern, for example, at a temperature of about 150° C. to about 230° C. for a predetermined time, for example, greater than or equal to about 10 min or greater than or equal to about 20 min.

When a quantum dot-polymer composite as obtained is used as a color filter, two or three types of compositions each separately including red light emitting quantum dots, green light emitting quantum dots, or optionally, blue light emitting quantum dots, are prepared. The patterning process is repeated as many times as desired (e.g., two times or three times) for each composition to provide a quantum dot-polymer composite having a desirable pattern (S6).

An ink composition of an embodiment may form a pattern by depositing the ink including nanomaterials (e.g., plurality of quantum dots and plurality of luminous carbon nanotubes) and a liquid vehicle on a desired region of a substrate and optionally removing the liquid vehicle and/or conducting a polymerization.

In embodiments, a layered structure includes a substrate (e.g., a transparent substrate); and a luminescent layer (e.g., photoluminescent layer) disposed on the substrate and including a first repeating section configured to emit a first light and a second repeating section configured to emit a second light, the second light having a wavelength (peak wavelength) different from that of the first light, and wherein at least one of the first repeating section and the second repeating section includes a plurality of quantum dots and a plurality of luminous carbon nanoparticles, wherein the plurality of quantum dots includes a Group II-VI compound, a Group III-V compound, a Group IV-VI compound, or a combination thereof, wherein the plurality of luminous carbon nanoparticles have a size (e.g., an average size) of less than or equal to about 10 nm, and exhibit both a D band and a G band in a Raman spectrum thereof, and wherein at least a portion of the plurality of luminous carbon nanoparticles absorb light having a wavelength of greater than or equal to about 400 nm (e.g., greater than or equal to about 420 nm) and a maximum luminous peak wavelength is greater than or equal to about 480 nm (e.g., greater than or equal to about 500 nm). The luminescent layer may further include a third repeating section configured to emit or pass a third light, the third light being different from the first and second lights.

Figure 2:
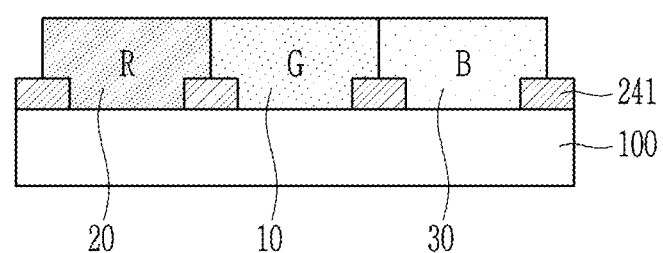
FIG. 2 is a cross-sectional view of a layered structure according to an exemplary embodiment.

Details of the quantum dots and the luminous carbon nanoparticles are the same as set forth above. As shown in FIG. 2, at least one (or both) of the first repeating section 10 and the second repeating section 20 may include the aforementioned quantum dot polymer composite. At least one (or both) of the first repeating section 10 and the second repeating section 20 may include a quantum dot pattern prepared from the aforementioned photosensitive composition or ink composition. (See FIG. 2) Details of the quantum dot polymer composite are the same as set forth above. The first repeating section 10 may include a green (G) light emitting quantum dot. The second repeating section 20 may include a red (R) light emitting quantum dot. The third repeating section 30 may include a blue (B) light quantum dot and/or a light transmitting (or translucent) polymer. The layered structure includes a black matrix 241 that may optically isolated each of the sections. The repeating sections are disposed on a substrate 100.

The substrate 100 may include a transparent material and may also include an insulating material, and thus may be both an insulating and transparent substrate. The substrate may include glass, a polymer, an inorganic material such as $Al_2O_3$ or ZnO, or a combination thereof, but is not limited thereto. The polymer may include a polyester such as polyethylene terephthalate (PET) or polyethylene naphthalate (PEN), polycarbonate, polyimide, polyamide-imide, a poly(C1-C6 alkyl) (meth)acrylate, poly(meth)acrylic acid, a thiolene polymer, polysiloxane (e.g., PDMS), or a combination thereof.

As used herein, the term "transparent" refers to having a light transmittance of greater than or equal to about 85%(, for example, greater than or equal to about 88%, greater than or equal to about 90%, greater than or equal to about 95%, greater than or equal to about 97%, or greater than or equal to about 99% for a predetermined wavelength of light (e.g., light emitted from the quantum dots included in the luminescent layer). A thickness of the (transparent) substrate may be appropriately selected considering a substrate material but is not particularly limited. The (transparent) substrate may have flexibility. The (transparent) substrate may be an upper substrate of a liquid crystal panel for a liquid crystal display device. At least a portion of the substrate may be configured to cut (absorb or reflect) blue light. A layer capable of blocking (e.g., absorbing or reflecting) blue light, also referred to herein as a "blue cut layer" or "blue light absorption layer", may be disposed on at least one surface of the substrate. For example, the blue cut layer (blue light absorption layer) may include an organic material and a predetermined dye, such as, for example, a yellow dye or a dye capable of absorbing blue light and transmitting green and/or red light.

A maximum (photo)luminescent peak wavelength (also referred to as "a peak wavelength") of the first light (G) may be in a range of greater than about 480 nm and less than or equal to about 580 nm, for example, in a range of greater than about 500 nm and less than or equal to about 550 nm, or from 500 nm to 540 nm. A maximum photoluminescent peak wavelength of the second light (R) may be in a range of greater than about 580 nm and less than or equal to about 680 nm, for example, in a range of greater than about 610 nm and less than or equal to about 640 nm, or from 600 nm to 650 nm. A maximum photoluminescent peak wavelength of the third light (B) may be in a range of greater than or equal to about 380 nm (e.g., greater than or equal to about 440 nm) and less than or equal to about 480 nm (or less than or equal to about 470 nm).

The quantum dot polymer composite or the layered structure may be included in an electronic device. The electronic devices may include a light emitting diode (LED), an organic light emitting diode (OLED), a sensor, an imaging sensor, a solar cell, or a display device. The display device may be a liquid crystal display device or an OLED device. In some non-limiting embodiments, the aforementioned quantum dot polymer composite may be included in a quantum dot-based color filter.

In another embodiment, a display device (e.g., liquid crystal display) includes a light source, and a light emitting element including the aforementioned layered structure.

The light source may be configured to provide incident light to the light emitting element including the layered structure. The incident light may have a wavelength of about 440 nm to about 480 nm such as about 440 nm to about 470 nm. The incident light may be the third light.

Figure 3A:
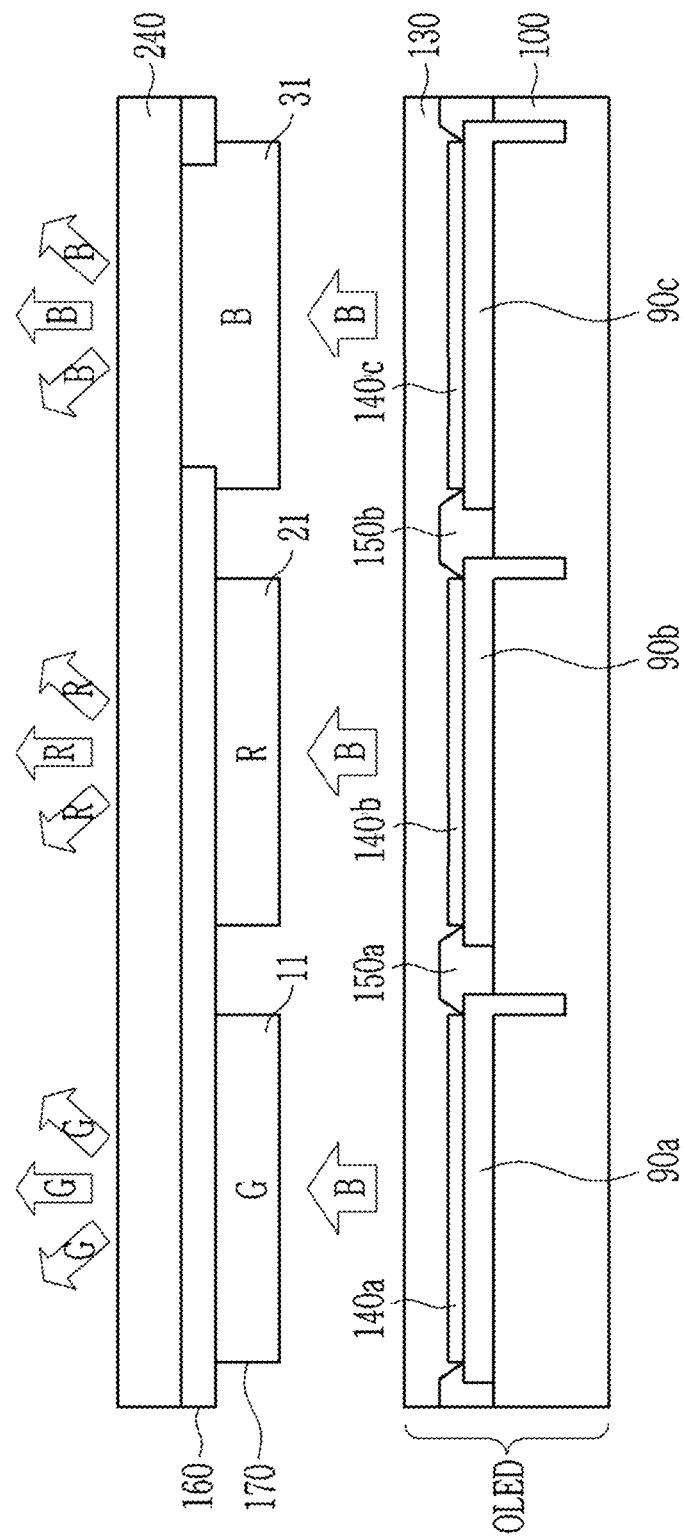
FIG. 3A is a cross-sectional view of a device according to an exemplary embodiment.
Figure 3B:
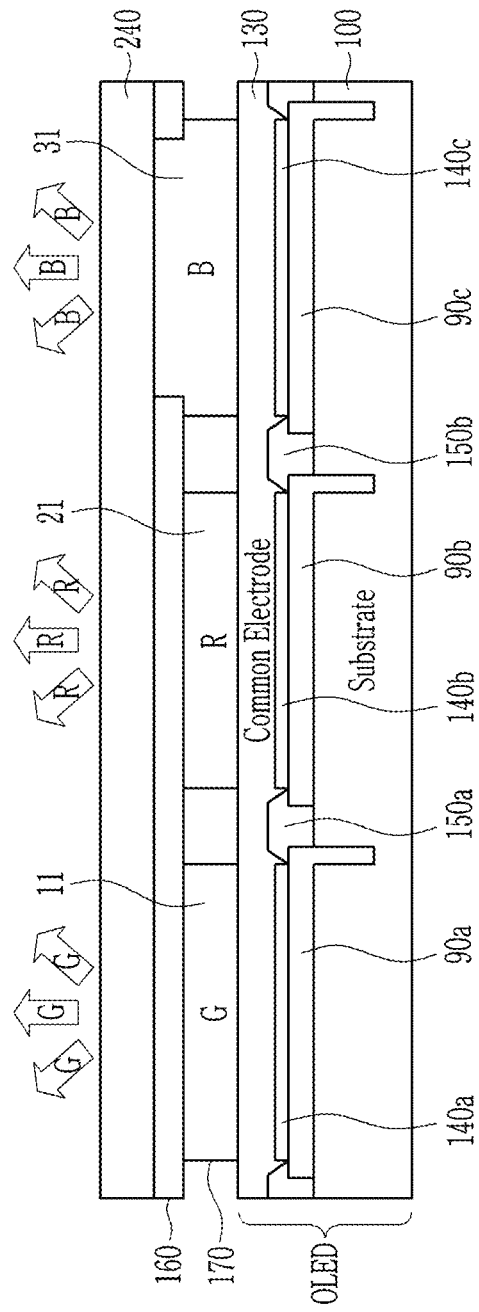
FIG. 3B is a cross-sectional view of a device according to another exemplary embodiment.

FIG. 3A and FIG. 3B show a schematic cross-sectional view of a display of an embodiment of a layered structure. Referring to FIG. 3A and FIG. 3B, the light source may include an organic light emitting diode OLED. For example, the OLED may emit blue light or a light having a wavelength in a region of about 500 nm or less. The organic light emitting diode OLED may include (at least two) pixel electrodes 90*a*, 90*b*, 90*c* formed on a substrate 100, a pixel defining layer 150*a*, 150*b* formed between the adjacent pixel electrodes 90*a*, 90*b*, 90*c*, an organic light emitting layer 140*a*, 140*b*, 140*c* formed on the pixel electrodes 90*a*, 90*b*, 90*c*, and a common electrode layer 130 formed on the organic light emitting layer 140*a*, 140*b*, 140*c*.

A thin film transistor and a substrate may be disposed under the organic light emitting diode. The pixel areas of the OLED may be disposed corresponding to the first, second, and third sections that will be described in detail below, respectively.

The layered structure that includes a quantum dot-polymer composite pattern (e.g. including a first repeating section including green light emitting quantum dots and/or a second repeating section including red light emitting quantum dots) and a substrate, or the quantum dot-polymer composite pattern, may be disposed on or over a light source, for example, directly on the light source.

The light (e.g., blue light) emitted from the light source may enter the second section 21 and the first section 11 of the pattern to emit (e.g., converted) red light R and green light G, respectively. The blue light B emitted from the light source passes through or transmits from the third section 31. Over the second section 21 emitting red light and/or the first section 11 emitting green light, an optical element 160 may be disposed. The optical element may be a blue cut layer which cuts (e.g., reflects or absorbs) blue light and optionally green light, or a first optical filter. The blue cut layer 160 may be disposed on the upper substrate 240. The blue cut layer 160 may be disposed between the upper substrate 240 and the quantum dot-polymer composite pattern and over the first section 11 and the second section 21. Details of the blue cut layer are the same as set forth for the first optical filter 310 below.

The device may be fabricated by separately preparing the layered structure and the OLED (for example, the blue OLED), respectively, and combining them. Alternatively, the device may be fabricated by directly forming the pattern of the quantum dot-polymer composite over the OLED.

In another embodiment, the display device may further include a lower substrate 210, an optical element (e.g. polarizer) 300 disposed below the lower substrate 210, and a liquid crystal layer 220 interposed between the layered structure and the lower substrate 210. The layered structure may be disposed in such a manner that a light emitting layer (i.e., the quantum dot-polymer composite pattern) faces the liquid crystal layer. The display device may further include an optical element (e.g. polarizer) 300 between the liquid crystal layer 220 and the light emitting layer. The light source may further include an LED and optionally a light guide panel.

Figure 4:
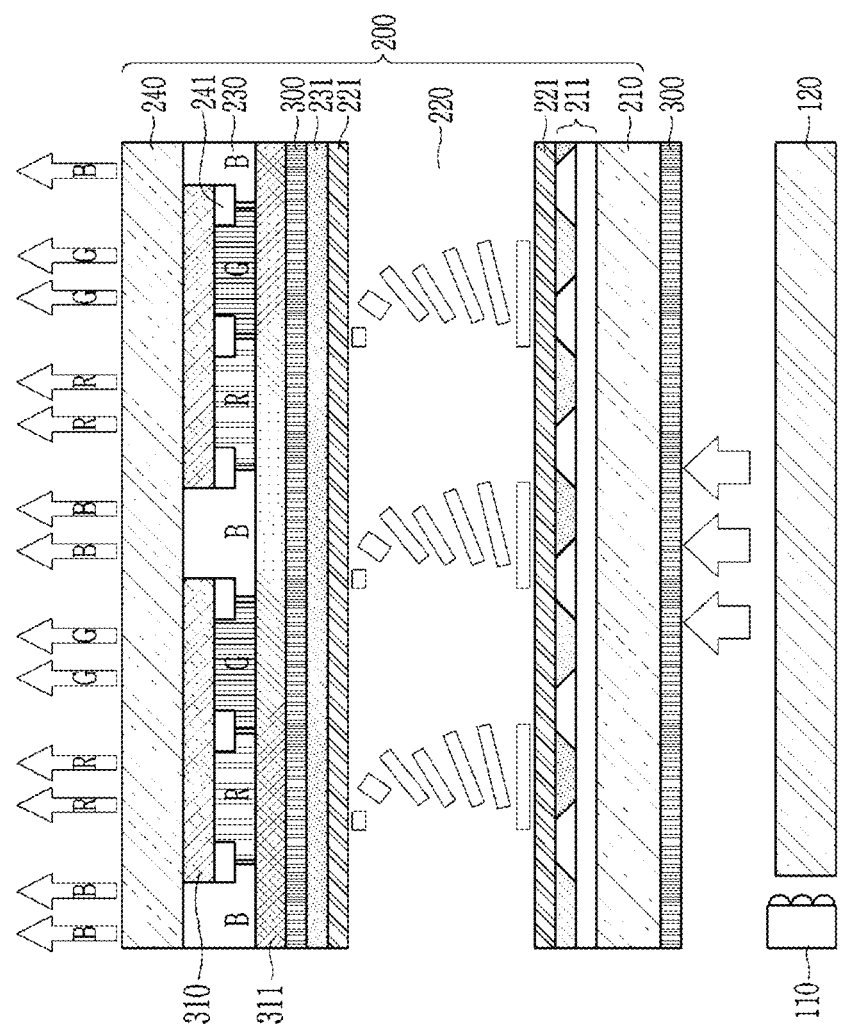
FIG. 4 is a cross-sectional view of a device according to yet another exemplary embodiment.

Referring to FIG. 4, in a non-limiting embodiment, the display device includes a liquid crystal panel 200, an optical element 300 (e.g. polarizer) disposed on and/or under the liquid crystal panel 200, and a backlight unit including a blue light emitting light source 110 under a lower optical element 300. The backlight unit may include a light source 110 and a light guide 120 (edge type). Alternatively, the backlight unit may be a direct light source without a light guide (not shown). The liquid crystal panel 200 may include a lower substrate 210, a upper substrate 240, and a liquid crystal layer 220 between the upper and lower substrates, and a light emitting layer (color filter layer) 230 disposed on or under the upper substrate 240. The light emitting layer 230 may include the quantum dot-polymer composite (or a pattern thereof).

A wire plate 211 is provided on an internal surface, for example, on the upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 may be disposed on the wire plate 211. The liquid crystal layer 220 may include an alignment layer 221 on an upper surface of the liquid crystal layer 220 and on a lower surface of the liquid crystal layer 220, to initially align the liquid crystal material included therein. Details regarding a liquid crystal material, an alignment layer material, a method of forming an alignment layer, a method of forming a liquid crystal layer, a thickness of liquid crystal layer, or the like are known and are not particularly limited.

In an embodiment, an upper optical element or an upper polarizer 300 may be provided between the liquid crystal layer 220 and the upper substrate 240, but it is not limited thereto. For example, the upper optical element or polarizer 300 may be disposed between the liquid crystal layer 220 (or a common electrode 231) and the light emitting layer (or the quantum dot-polymer composite pattern). A black matrix 241 may be provided under the upper substrate 240 (e.g., on a lower surface thereof). Openings within the black matrix 241 are aligned with a gate line, a data line, and a thin film transistor of a wire plate 211 on the lower substrate 210. A second section (R) including a color filter emitting red light, a first section (G) including a color filter emitting green light and/or a third section (B) including a color filter for emitting or transmitting blue light may be disposed in the openings within the black matrix 241. For example, the black matrix 241 may have a lattice shape. The light emitting layer (color filter layer) 230 may be on a transparent common electrode 231.

If desired, the display device may further include a blue cut filter, hereinafter, also referred to as a first optical filter layer. The first optical filter layer 310 may be disposed between upper surfaces of the second section (R) and the first section (G) and the lower surface of the upper substrate 240, or on an upper surface of the upper substrate (240). The first optical filter layer 310 may include a sheet having openings that correspond to the third section (B) (e.g., a pixel area showing a blue color) and may be formed on portions corresponding to the first and second sections (G, R). The first optical filter layer 310 may be formed as a single body structure over the portions of the light emitting layer 230 corresponding to the first and second sections (G, R), and which are other than the portions overlapping the third section, but is not limited thereto. Alternatively, at least two first optical filter layers may be spaced apart from each other and may be disposed over each of the portions overlapping the first and the second sections, respectively.

For example, the first optical filter layer may block light having a predetermined wavelength range in the visible light range and may transmit light having another wavelength range. For example, the first optical filter layer may block blue light and transmit light other than blue light. For example, the first optical filter layer may transmit green light, red light, or yellow light (e.g., the mixed light of the green light and the red light).

The first optical filter layer may include a polymer thin film including a dye and/or a pigment that absorbs light having a specific wavelength, i.e., the wavelength to be blocked. The first optical filter layer may block at least 80%, or at least 90%, even at least 95% of blue light having a wavelength of less than or equal to about 480 nm. With respect to the visible light having other wavelengths, the first optical filter layer may have a light transmittance of greater than or equal to about 70%, for example, greater than or equal to about 80%, greater than or equal to about 90%, or even up to 100%.

The first optical filter layer may absorb and substantially block blue light having a wavelength of less than or equal to about 500 nm, and for example, may selectively transmit green light or red light. In this case, at least two first optical filter layers may be spaced apart and disposed on each of the portions overlapping the first and second sections, respectively. For example, the first optical filter layer selectively transmitting red light may be disposed on the portion overlapping the section emitting red light and the first optical filter layer selectively transmitting green light may be disposed on the portion overlapping the section emitting green light.

In some embodiments, the first optical filter layer may include at least one of a first region and a second region. The first region of the first optical filter layer blocks (e.g., absorbs) blue light and red light and transmits light having a wavelength of a predetermined range, e.g., a wavelength greater than or equal to about 500 nm, greater than or equal to about 510 nm, or greater than or equal to about 515 nm, and less than or equal to about 550 nm, less than or equal to about 540 nm, less than or equal to about 535 nm, less than or equal to about 530 nm, less than or equal to about 525 nm, or less than or equal to about 520 nm. The second region of the first optical filter layer blocks (e.g., absorb) blue light and green light and transmits light having a wavelength of a predetermined range, e.g., a wavelength of greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm. The first region of the first optical filter layer may be disposed (directly) on or over a location overlapping a green light emitting section and the second region of the first optical filter layer may be disposed (directly) on or over a location overlapping a red light emitting section. The first region and the second region may be optically isolated from one another, for example, by a black matrix. The first optical filter layer may contribute to improving the color purity of a display device.

The first optical filter layer may be a reflection type filter including a plurality of layers (e.g., inorganic material layers) each having a different reflective index. For example, in the first optical layer, two layers having different reflective indices may be alternately stacked on each other. For example, a layer having a high reflective index and a layer having a low reflective index may be alternately laminated with each other.

The display device may further include a second optical filter layer 311 (e.g., red/green light or yellow light recycling layer) that is disposed between the light emitting layer 230 and the liquid crystal layer 220, and between the light emitting layer 230- (e.g., the quantum dot polymer composite layer) and the upper polarizer 300. The second optical filter layer 311 may transmit at least a portion of a third light, and reflect at least a portion of a first light and/or a second light. The second optical filter layer may reflect light having a wavelength of greater than 500 nm. The first light may be green (or red) light, the second light may be red (or green) light, and the third light may be blue light.

Hereinafter, the embodiments are illustrated in more detail with reference to examples. However, the present disclosure is not limited thereto.

EXAMPLES

Analysis Method

[1] Photoluminescence Analysis

Photoluminescence Analysis is made by using Hitachi F-7000 spectrometer and a photoluminescence spectrum is obtained.

[2] UV-Visible Absorption Analysis

Hitachi U-3310 spectrometer is used to perform a UV spectroscopy analysis and UV-Visible absorption spectrum is obtained.

[3] Blue Light Absorption Rate (Excitation Light Absorption Rate)

Blue light absorption rate is measured by using Otsuka QE2100.

[4] Raman Spectroscopy

A Raman spectroscopic analysis is carried out by using InVia micro-Raman K.

[5] Transmission Electron Microscopy Analysis

A TEM analysis is made by using Titan ChemiSTEM.

Reference Example 1: Production of Quantum Dots (1) 0.2 millimoles (mmol) of indium acetate, 0.6 mmol of palmitic acid, and 10 milliliters (mL) of 1-octadecene are placed in a flask, subjected to a vacuum state at 120° C. for one hour, and heated to 280° C. after the atmosphere in the flask is exchanged with $N_2$. Then, a mixed solution of 0.1 millimole (mmol) of tris(trimethylsilyl)phosphine (TMS$_3$P) and 0.5 milliliter (mL) of trioctylphosphine (TOP) is quickly injected, and the reaction proceeds for a predetermined time (e.g., for 20 minutes). The reaction mixture then is rapidly cooled and acetone is added thereto to produce nanocrystals, which are then separated by centrifugation and dispersed in toluene to obtain a toluene dispersion of the InP core nanocrystals (optical density: about 0.15).

0.3 mmol (0.056 grams, g) of zinc acetate, 0.6 mmol (0.189 g) of oleic acid, and 10 mL of trioctylamine are placed in a flask, subjected to a vacuum state at 120° C. for 10 minutes, and then heated to 220° C. after the atmosphere in the flask is exchanged with N$_2$. Then, a toluene dispersion of the InP core nanocrystals prepared as described above, a predetermined amount (e.g., about 0.2 mmol) of Se/TOP (i.e., selenium dissolved or dispersed in the trioctylphosphine), and a predetermined amount (e.g., about 0.2 mmol) of S/TOP (i.e., sulfur dissolved or dispersed in the trioctylphosphine) are added to the flask sequentially, while its temperature is raised to a reaction temperature over 280° C. After the injection of the Se/TOP and the S/TOP, the reaction proceeds for a predetermined time (e.g., 30 minutes), respectively. After the reaction, the resulting solution is quickly cooled to room temperature to obtain a reaction mixture including InP/ZnSeS semiconductor nanocrystals.

(2) An excess amount of ethanol is added to the reaction mixture including the resulting semiconductor nanocrystals, which is then centrifuged to remove an excess of organic material from the reaction mixture of the core/shell semiconductor nanocrystals. After centrifugation, the supernatant is discarded and the precipitate is dried and dispersed in chloroform to obtain a quantum dot solution (hereinafter, QD solution). A UV-vis absorption spectrum the QD solution is measured.

The prepared quantum dot emits green light having a maximum photoluminescent peak wavelength of about 532 nm. The quantum yield of the prepared quantum dot is greater than or equal to about 90%.

Reference Example 2: Production of Luminous Carbon Nanoparticles

[1] 1 g of citric acid (1 g) and 1 mL of 0.5 M nitric acid are added into 1 mL of water. The mixture is vigorously stirred to dissolve the citric acid. 2 mL of oleyl amine and 18 mL of 2-octadecene are injected thereto and vigorously stirred to form a milky emulsion. The obtained emulsion is heated to 250° C. under an argon atmosphere and a reaction proceeds for 150 minutes. Methanol is added to the resulting solution including the product to obtain a precipitate, which is then centrifuged to separate luminous carbon nanoparticles (hereinafter, also referred to as "CQD"). The luminous carbon nanoparticles are dispersed in hexane and then filtered and dried under vacuum.

Figure 5:
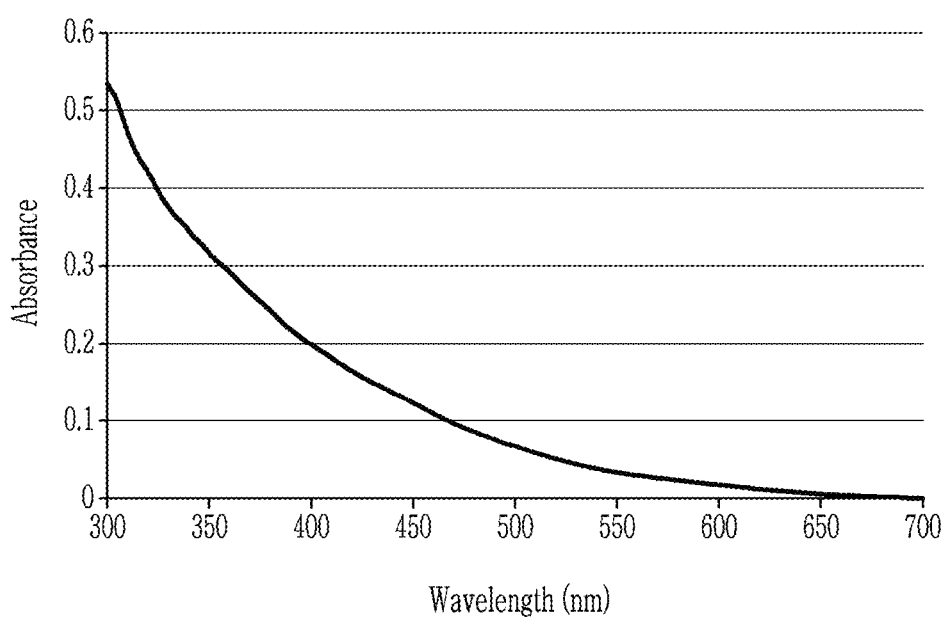
FIG. 5 is a graph of absorbance versus wavelength (nanometers, nm) showing a UV-Vis absorption spectrum of the luminous carbon nanoparticles prepared in Reference Example 2.

[2] UV-vis absorption spectroscopic analysis and photoluminescence spectroscopic analysis are performed for the prepared luminous carbon nanoparticles and the results are shown in FIG. 5 and Table 1, respectively.

TABLE 1

| Excitation wavelength (nm) | the maximum PL peak wavelength (nm) | FWHM (nm) |
|---|---|---|
| 400 | 493 | 153 |
| 420 | 514 | 152 |

TABLE 1-continued

| Excitation wavelength (nm) | the maximum PL peak wavelength (nm) | FWHM (nm) |
|---|---|---|
| 440 | 533 | 137 |
| 460 | 551 | 132 |
| 480 | 555 | 124 |
| 500 | 561 | 118 |
| 520 | 581 | 116 |
| 540 | 602 | 110 |
| 560 | 601 | — |

Figure 6:
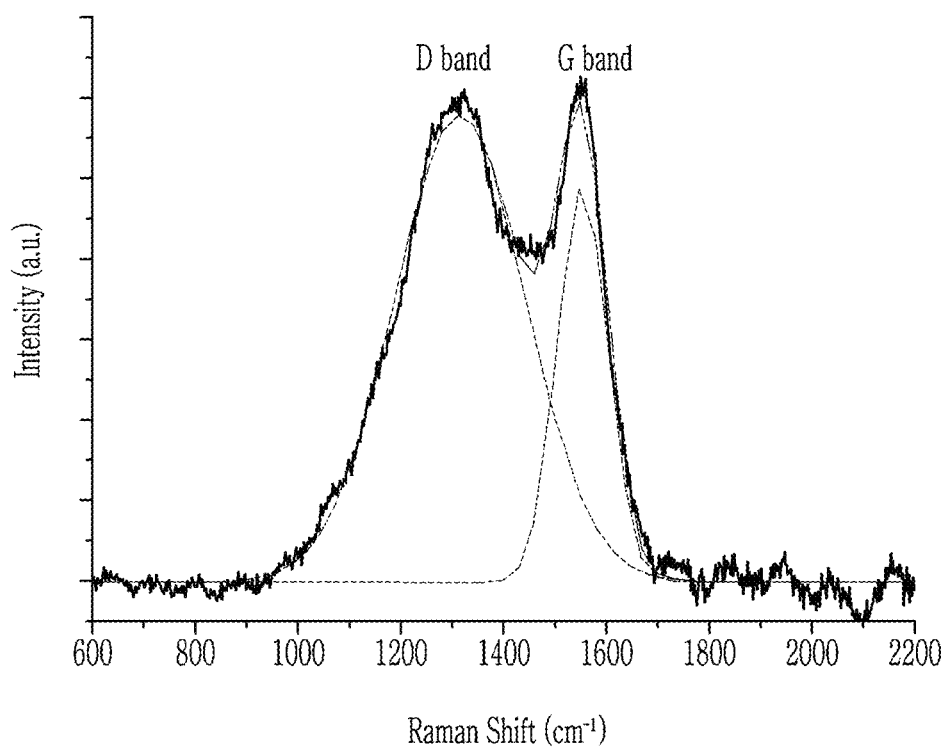
FIG. 6 is a graph of intensity (arbitrary units, a.u.) versus Raman shift ($cm^{-1}$) view showing a Raman spectrum of the luminous carbon nanoparticles prepared in Reference Example 2.

[3] A Raman spectroscopic analysis is made for the prepared luminous carbon nanoparticles and the results are shown in FIG. 6. The results of FIG. 6 confirm that the prepared luminous carbon nanoparticles shows an integral value of a D band that is greater than that of a G band.

Figure 7:
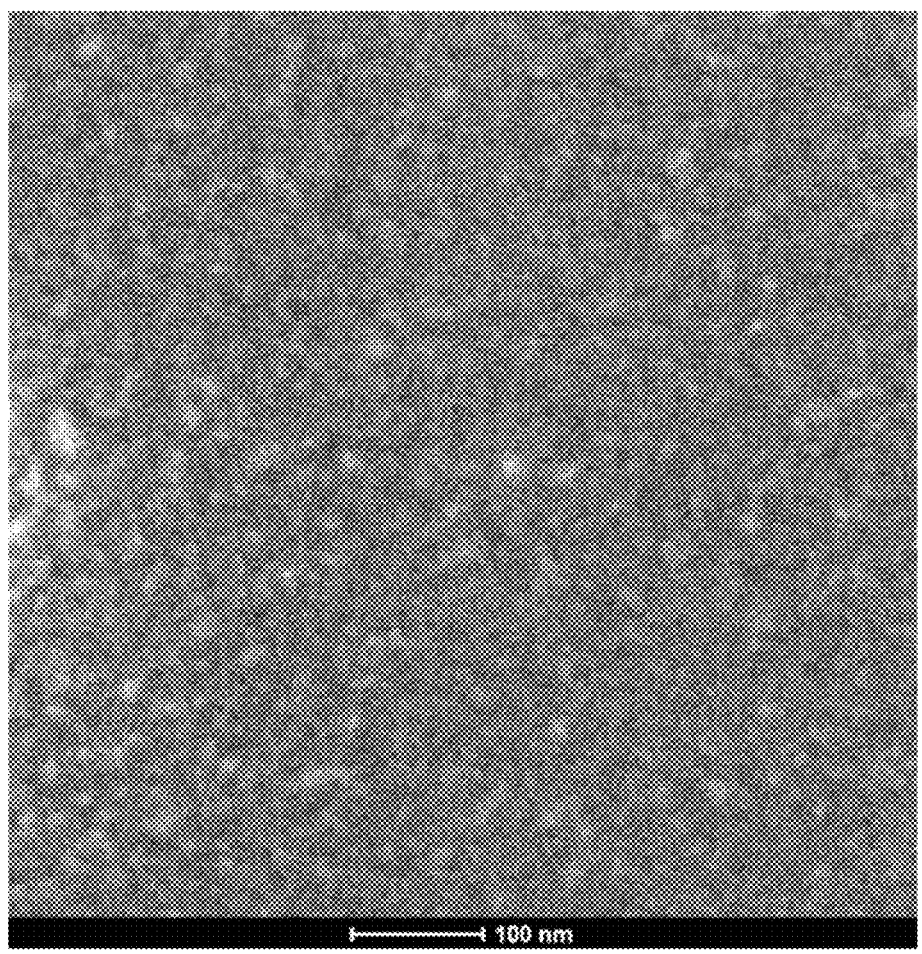
FIG. 7 is a transmission electronic microscopic image of the luminous carbon nanoparticles prepared in Reference Example 2.

[4] A TEM analysis is made for the prepared luminous carbon nanoparticles and the results are shown in FIG. 7. The prepared luminous carbon nanoparticles has an (average) size of about 8 nm±2 nm Examples 1 to 2

[1] Preparation of Quantum Dot-Binder Dispersion

A chloroform dispersion of green light emitting quantum dots (InP/ZnSeS core/shell) prepared in Reference Example 1 is prepared. A chloroform dispersion of the luminous carbon nanoparticles prepared in Reference Example 2 is prepared. The chloroform dispersion of the QD and the prepared chloroform dispersion of the luminous carbon nanoparticles are mixed with a solution of a binder polymer, which is a four membered copolymer of methacrylic acid, benzyl methacrylate, hydroxyethyl methacrylate, and styrene, (acid value: 130 milligrams (mg) per gram of KOH (mg KOH/g), molecular weight: 8,000 g/mol, acrylic acid: benzyl methacrylate:hydroxyethyl methacrylate:styrene (molar ratio)=61.5%:12%:16.3%:10.2%) (solvent: propylene glycol monomethyl ether acetate, PGMEA, a concentration of 30 percent by weight, wt %) at a weight ratio shown in Table 2 to form a quantum dot-binder dispersion.

[2] Preparation of the Photosensitive Composition

To the quantum dot-binder dispersion prepared above, a hexaacrylate having the following structure (as a photopolymerizable monomer), ethylene glycol di-3-mercaptopropionate (hereinafter, 2T, as a multi-thiol compound), an oxime ester compound (as an initiator), and PGMEA (as a solvent) are added to obtain a composition.

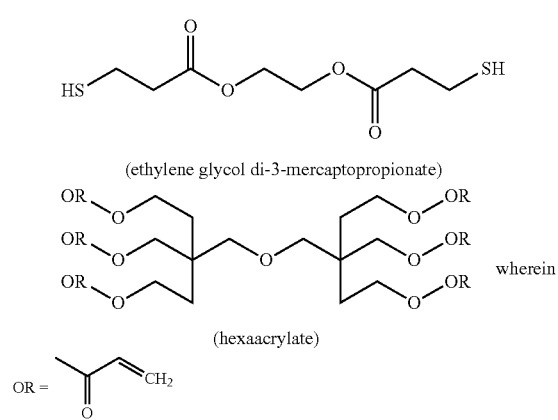

The prepared composition includes 10.75 wt % of quantum dots+CQD, 6.2 wt % of the binder polymer, 5.3 wt % of the multi-thiol compound, 2.25 wt % of the photopolymerizable monomer, 0.5 wt % of the photoinitiator, and a balance amount of the solvent, based on a total weight of the composition.

The total solid content of the composition is 25% and among the TSC, a total weight content of the quantum dots and the luminous carbon particles is about 43%.

The composition may form a dispersion without a noticeable phenomenon of aggregation.

[3] Formation of Quantum Dot-Polymer Composite

The composition obtained above is spin-coated on a glass substrate at 180 revolutions per minute (rpm) for 5 seconds (s) to provide a film having a thickness of about 6 μm. The obtained film is pre-baked at 100° C. (PRB). The pre-baked film is exposed to light (wavelength: 365 nanometers (nm), intensity: 100 millijoules, mJ) under a mask having a predetermined pattern (e.g., a square dot or stripe pattern) for 1 s (EXP) and developed with a potassium hydroxide aqueous solution (conc.: 0.043%) for 50 seconds to obtain a pattern of a quantum dot polymer composite (line width: 100 um).

Comparative Example 1

A pattern of a quantum dot polymer composite is prepared in the same manner set forth in Example 1 except the luminous carbon nanoparticles were not used.

Experimental Example 1

For each of the compositions prepared in Examples 1 to 2 and Comparative Example 1, a UV-Vis absorption spectroscopic analysis is made, and absorption rate with respect to light of 450 nm, and the results are shown in Table 2.

For each of the pre-baked film prepared in Examples 1 to 2 and Comparative Example 1, a blue light absorption rate is measured and the results are shown in Table 2.

TABLE 2

|  | QD:CQD weight ratio | Blue light absorption rate (%) | Relative absorption rate at 450 nm |
| --- | --- | --- | --- |
| Comparative Example 1 | 45:0 | 82.7 | 100% |
| Example 1 | 44:1 | 83.1 | 110.6% |
| Example 2 | 40:5 | 86.9 | 151.6% |

It can be seen from the data in table 2 that the compositions comprising a combination of the quantum dots and the luminous carbon nanoparticles of Examples 1 and 2 have increased blue light absorption rate and relative absorption rate at 450 nm as compared with the composition comprising only the quantum dots, but no luminous carbon nanoparticles of Comparative Example 1.

Experimental Example 2

For each of the compositions prepared in Examples 1 to 3 and Comparative Example 1, a photoluminescent spectroscopic analysis is made. The results indicate that all the prepared composition show a similar level of light emitting efficiency and have a similar level of FWHM.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A composition comprising:
    a plurality of quantum dots;
    a plurality of luminous carbon nanoparticles;
    a carboxylic acid group-containing binder;
    a polymerizable monomer comprising a carbon-carbon double bond; and
    an initiator,
    wherein the plurality of quantum dots comprises a Group II-VI compound, a Group III-V compound, a Group IV-VI compound, or a combination thereof,
    the plurality of luminous carbon nanoparticles have a size of less than or equal to about 10 nanometers, and exhibit both a D band and a G band in a Raman spectrum thereof, and
    at least a portion of the plurality of luminous carbon nanoparticles absorb light having a wavelength of greater than or equal to about 400 nanometers and a maximum luminous peak wavelength thereof is greater than or equal to about 480 nanometers.

2. The composition of claim 1, wherein the plurality of quantum dots do not comprise cadmium.

3. The composition of claim 1, wherein a quantum dot of the plurality of quantum dots comprises a core comprising a first semiconductor nanocrystal material and a shell disposed on the core and comprising a second semiconductor nanocrystal material, the second semiconductor nanocrystal material being different from the first semiconductor nanocrystal material,
    wherein the core comprises a metal and a non-metal, the metal comprising indium, zinc, or a combination thereof, and the non-metal comprising phosphorous, selenium, tellurium, or a combination thereof, and
    wherein the shell comprises zinc, sulfur, and optionally selenium.

4. The composition of claim 3, wherein a maximum photoluminescent peak wavelength of the plurality of the quantum dots is in a range between about 500 nanometers and about 650 nanometers.

5. The composition of claim 1, wherein the plurality of quantum dots have a quantum efficiency of greater than or equal to about 70%.

6. The composition of claim 1, wherein the plurality of the luminous carbon nanoparticles have a size of greater than 1 nanometer and less than or equal to about 10 nanometers.

7. The composition of claim 1, wherein in the Raman spectrum of the luminous carbon nanoparticles, an integral value of the D band is greater than an integral value of the G band.

8. The composition of claim 1, wherein at least a portion of the plurality of luminous carbon nanoparticles absorb light having a wavelength of greater than or equal to about 420 nanometers and a maximum luminous peak wavelength is greater than or equal to about 510 nanometers.

9. The composition of claim 1, wherein at least a portion of the plurality of luminous carbon nanoparticles absorb light having a wavelength of greater than or equal to about 460 nanometers and a maximum luminous peak wavelength is greater than or equal to about 530 nanometers.

10. The composition of claim 1, wherein the plurality of luminous carbon nanoparticles have a quantum efficiency of greater than or equal to about 10 percent.

11. The composition of claim 1, wherein an amount of the plurality of luminous carbon nanoparticles is greater than or equal to about 1 part by weight and less than or equal to about 33 parts by weight, with respect to 100 parts by weight of the plurality of quantum dots.

12. The composition of claim 1, wherein an amount of the plurality of luminous carbon nanoparticles is greater than or equal to about 2 parts by weight and less than or equal to about 15 parts by weight, with respect to 100 parts by weight of the plurality of quantum dots.

13. The composition of claim 1, wherein the carboxylic acid group-containing binder has an acid value of greater than or equal to about 50 milligrams of KOH per gram and less than or equal to about 250 milligrams of KOH per gram.

14. The composition of claim 1, wherein the carboxylic acid group-containing binder comprises a copolymer of a monomer combination comprising a first monomer, a second monomer, and optionally a third monomer, the first monomer comprising a carboxylic acid group and a carbon-carbon double bond, the second monomer comprising a carbon-carbon double bond and a hydrophobic moiety and not including a carboxylic acid group, and the third monomer comprising a carbon-carbon double bond and a hydrophilic moiety and not including a carboxylic acid group;
a multi-aromatic ring-containing polymer comprising a carboxylic acid group and a backbone structure in a main chain, wherein the backbone structure comprises a cyclic group comprising a quaternary carbon atom, and two aromatic rings bound to the quaternary carbon atom; or
a combination thereof.

15. The composition of claim 1, wherein the polymerizable monomer comprises a (meth)acrylate monomer having at least one (meth)acrylate group.

16. The composition of claim 1, wherein the composition further comprises a multi-thiol compound represented by Chemical Formula 1, a metal oxide particle, or a combination thereof:

Chemical Formula 1
wherein,
$R^1$ is hydrogen, a substituted or unsubstituted C1 to C40 linear or branched alkyl group, a C2 to C40 linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —NH$_2$, a substituted or unsubstituted C1 to C30 amine group of the formula —NRR' (wherein R and R' are the same or different, and are independently hydrogen or a C1 to C30 linear or branched alkyl group, and R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide group of the formula —RC(=O)X (wherein R is a substituted or unsubstituted C1 to C20 alkylene group and X is a halogen, —C(=O)OR' (wherein R' is hydrogen or a C1 to C20 linear or branched alkyl group), —CN, —C(=O)NRR' (wherein R and R' are the same or different and are independently hydrogen or a C1 to C20 linear or branched alkyl group), —C(=O)ONRR' (wherein R and R' are the same or different, and are independently hydrogen or a C1 to C20 linear or branched alkyl group) or a combination thereof, Li is a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C3 to C30 heterocycloalkylene group, wherein at least one methylene group of the substituted or unsubstituted C1 to C30 alkylene group or the substituted or unsubstituted C2 to C30 alkenylene group is replaced by a sulfonyl group, a carbonyl group, an ether group, a sulfide group, a sulfoxide group, an ester group, an amide group of the formula (—C(=O)NR-) (wherein R is hydrogen or a C1 to C10 alkyl group), or a combination thereof,
$Y_1$ is a single bond, a substituted or unsubstituted C1 to C30 alkylene group, a substituted or unsubstituted C2 to C30 alkenylene group, or a C2 to C30 alkylene group or a C3 to C30 alkenylene group in which at least one methylene group is replaced by a sulfonyl group, a carbonyl group, an ether group, a sulfide group, a sulfoxide group, an ester group , an amide group of the formula —C(=O)NR— (wherein R is hydrogen or a C1 to C10 linear or branched alkyl group), an imine group of the formula (—NR—) (wherein R is hydrogen or a C1 to C10 linear or branched alkyl group), or a combination thereof,
m is an integer of 1 or more,
k1 is 0 or an integer of 1 or more, k2 is an integer of 1 or more, and
a sum of m and k2 is an integer of 3 or more,
provided that m does not exceed the valence of $Y_1$ when $Y_1$ is not a single bond, and
provided that a sum of k1 and k2 does not exceed the valence of $L_1$.

17. The composition of claim 1, wherein based on a total solid content weight of the composition,
an amount of the plurality of quantum dots is about 1 weight percent to about 60 weight percent;
an amount of the plurality of luminous carbon nanoparticles is about 0.01 weight percent to about 25 weight percent;
an amount of the carboxylic acid group containing binder is about 0.5 weight percent to about 70 weight percent;
an amount of the polymerizable monomer is about 1 weight percent to about 70 weight percent of; and
an amount of the initiator is about 0.01 weight percent to about 10 weight percent.

18. A quantum dot-polymer composite comprising:
a polymer matrix; and
a plurality of quantum dots and a plurality of luminous carbon nanoparticles dispersed in the polymer matrix;
wherein the plurality of quantum dots comprises a Group II-VI compound, a Group III-V compound, a Group IV-VI compound, or a combination thereof,
the plurality of luminous carbon nanoparticles have a size of less than or equal to about 10 nanometers, and exhibit both a D band and a G band in a Raman spectrum thereof, and
at least a portion of the plurality of luminous carbon nanoparticles absorb light having a wavelength of greater than or equal to about 400 nanometers and a maximum luminous peak wavelength thereof is greater than or equal to about 480 nanometers.

19. The quantum dot-polymer composite of claim 18, wherein the polymer matrix comprises a carboxylic acid group-containing binder, a cross-linked polymerization product of a photopolymerizable monomer comprising a carbon-carbon double bond, or a combination thereof.

20. The quantum dot-polymer composite of claim 18, wherein the plurality of luminous carbon nanoparticles have a size of greater than 1 nanometers and less than or equal to about 5 nanometers, and in the Raman spectrum of the plurality of luminous carbon nanoparticles, an integral value of the D band is greater than an integral value of the G band.

21. The quantum dot-polymer composite of claim 18, wherein the quantum dot polymer composite is a film having a thickness of about 5 micrometers to about 10 micrometers and an absorption rate of light having a wavelength of 450 nanometers of greater than or equal to about 80 percent.

22. The quantum dot-polymer composite of claim 18, wherein, based on a total weight of the quantum dot-polymer composite,
- an amount of the polymer matrix is greater than or equal to about 1 weight percent and less than or equal to about 75 weight percent,
- an amount of the plurality of quantum dots is greater than or equal to about 1 weight percent and less than or equal to about 75 weight percent, and
- an amount of the plurality of luminous carbon nanoparticles is greater than or equal to about 0.01 weight percent and less than or equal to about 25 weight percent.

23. A layered structure comprising:
a substrate; and
a luminescent layer disposed on the substrate and comprising,
  a first repeating section configured to emit a first light, and
  a second repeating section configured to emit a second light, the second light having a wavelength different from the wavelength of the first light, and wherein at least one of the first repeating section and the second repeating section comprises a plurality of quantum dots and a plurality of luminous carbon nanoparticles,
wherein the plurality of quantum dots comprises a Group II-VI compound, a Group III-V compound, a Group IV-VI compound, or a combination thereof,
wherein the plurality of luminous carbon nanoparticles have a size of less than or equal to about 10 nanometers, and exhibit both a D band and a G band in a Raman spectrum thereof, and
wherein at least a portion of the plurality of luminous carbon nanoparticles absorb light having a wavelength of greater than or equal to about 400 nanometers and a maximum luminous peak wavelength is greater than or equal to about 480 nanometers.

24. A display device comprising a light source, and a light emitting element comprising a layered structure of claim 23, wherein the light source is configured to provide incident light to the layered structure and the incident light has a luminescent peak wavelength of about 440 nanometers to about 480 nanometers.

25. The composition of claim 1, wherein the composition is configured to provide a quantum dot polymer composite and an absorption rate (%) of the quantum dot polymer composite with respect to excitation light having a wavelength of 450 nm defined by the following equation is greater than or equal to about 83%:

Absorption rate (%)=$\{1-(B'/B)\}\times 100\%$

B': amount of the excitation light passing through the composite

B: total amount of the excitation light.

26. The quantum dot-polymer composite of claim 18, wherein an absorption rate (%) of the quantum dot polymer composite with respect to excitation light having a wavelength of 450 nm defined by the following equation is greater than or equal to about 83%:

Absorption rate (%)=$\{1-(B'/B)\}\times 100\%$

B': amount of the excitation light passing through the composite

B: total amount of the excitation light.

\* \* \* \* \*